(12) United States Patent
Jeng et al.

(10) Patent No.: US 11,107,801 B2
(45) Date of Patent: Aug. 31, 2021

(54) MULTI FAN-OUT PACKAGE STRUCTURE AND METHOD FOR FORMING THE SAME

(71) Applicant: Taiwan Semiconductor Manufacturing Co., Ltd., Hsinchu (TW)

(72) Inventors: Shin-Puu Jeng, Hsinchu (TW); Po-Yao Lin, Hsinchu County (TW); Shuo-Mao Chen, New Taipei (TW); Feng-Cheng Hsu, New Taipei (TW); Chia-Hsiang Lin, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 10 days.

(21) Appl. No.: 16/233,653

(22) Filed: Dec. 27, 2018

(65) Prior Publication Data
US 2020/0075569 A1 Mar. 5, 2020

Related U.S. Application Data

(60) Provisional application No. 62/724,194, filed on Aug. 29, 2018.

(51) Int. Cl.
*H01L 21/44* (2006.01)
*H01L 21/48* (2006.01)
(Continued)

(52) U.S. Cl.
CPC ............ *H01L 25/18* (2013.01); *G03F 7/2022* (2013.01); *H01L 21/0337* (2013.01); *H01L 21/32* (2013.01); *H01L 23/481* (2013.01); *H01L 24/09* (2013.01); *H01L 24/17* (2013.01); *H01L 24/32* (2013.01); *H01L 25/50* (2013.01); (Continued)

(58) Field of Classification Search
CPC ... H01L 21/0337; H01L 21/32; H01L 23/481; H01L 24/09; H01L 24/17; H01L 24/32; H01L 25/50; H01L 21/48; H01L 21/4814; H01L 21/50; H01L 23/043;
(Continued)

(56) References Cited

U.S. PATENT DOCUMENTS 9,000,584 B2 4/2015 Lin et al.
9,048,222 B2 6/2015 Hung et al.
(Continued)

*Primary Examiner* — Jami Valentine Miller
*Assistant Examiner* — Dilinh P Nguyen
(74) *Attorney, Agent, or Firm* — Birch, Stewart, Kolasch & Birch, LLP

(57) ABSTRACT

A package structure and method for forming the same are provided. The package structure includes a first redistribution structure formed over a substrate, and the first redistribution structure includes a first conductive line, a second conductive line and a first overlapping conductive line between the first conductive line and the second conductive line. The first conductive line has a first width, the second conductive line which is parallel to the first conductive line has a second width, and the overlapping conductive line has a third width which is greater than the first width and the second width. The package structure includes a first package unit formed over the first redistribution structure, and the first package unit includes a first semiconductor die and a first die stack, and the first semiconductor die has a different function than the first die stack.

20 Claims, 37 Drawing Sheets

(51) Int. Cl.
    *H01L 21/50*     (2006.01)
    *H01L 25/18*     (2006.01)
    *H01L 23/00*     (2006.01)
    *H01L 23/48*     (2006.01)
    *H01L 21/32*     (2006.01)
    *H01L 25/00*     (2006.01)
    *G03F 7/20*     (2006.01)
    *H01L 21/033*     (2006.01)

(52) U.S. Cl.
    CPC ............... *H01L 2224/0231* (2013.01); *H01L 2224/02373* (2013.01); *H01L 2224/02379* (2013.01); *H01L 2924/1434* (2013.01)

(58) Field of Classification Search
    CPC . H01L 23/3164; H01L 23/36; H01L 2021/60; G03F 7/2022
    USPC ................................ 438/106, 121; 257/678
    See application file for complete search history.

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2012/0161279 A1* | 6/2012 | Lin ..................... H01L 28/10 257/531 |
| 2016/0322374 A1* | 11/2016 | Sano ................. H01L 21/76805 |

\* cited by examiner

MULTI FAN-OUT PACKAGE STRUCTURE AND METHOD FOR FORMING THE SAME

CROSS REFERENCE TO RELATED APPLICATIONS

This application claims the benefit of U.S. Provisional Application No. 62/724,194 filed on Aug. 29, 2018, and entitled "Package structure and method for forming the same", the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

New packaging technologies, such as package on package (PoP), have begun to be developed, in which a top package with a device die is bonded to a bottom package, with another device die. By adopting the new packaging technologies, various packages with different or similar functions are integrated together.

Although existing package structures and methods of fabricating package structure have generally been adequate for their intended purpose, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 2M' shows a cross-sectional representation of a package structure, in accordance with some embodiments of the disclosure.

FIG. 3A-1 shows a top-view representation of the exposed regions of a photoresist layer after a first exposure process, in accordance with some embodiments of the disclosure.

FIG. 3A-2 shows an enlarged representation of a region A in FIG. 3A-1.

FIG. 3B-1 shows a top-view representation of exposed regions of a photoresist layer after a second exposure process, in accordance with some embodiments of the disclosure.

FIG. 3B-2 shows an enlarged representation of the region A in FIG. 3A-1.

FIG. 3C-1 shows a top-view representation of a conductive layer in the redistribution structure of the package structure in FIG. 1, in accordance with some embodiments of the disclosure.

FIG. 3C-2 shows an enlarged representation of the region A of FIG. 3C-1.

DETAILED DESCRIPTION

Figure 1:
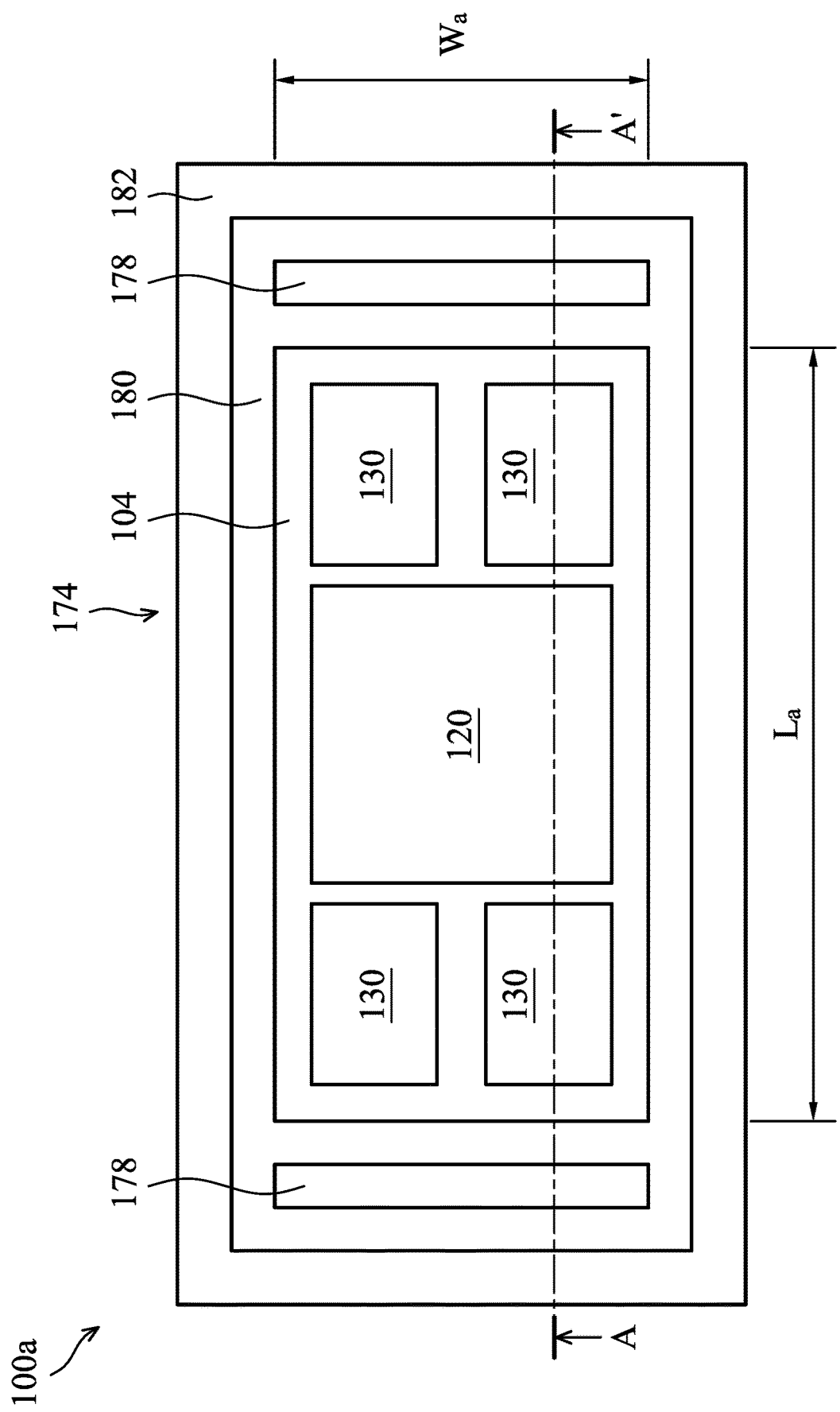
FIG. 1 shows a top-view representation of a package structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments for a package structure and method for forming the same are provided. FIG. 1 shows a top-view representation of a package structure 100a, in accordance with some embodiments of the disclosure. The package structure 100a is a multi-chip module (MCM) which includes at least two different function dies integrated over a fan-out redistribution structure. The package structure 100a may be a chip-on-wafer-on-substrate (CoWoS) package or another suitable package.

As shown in FIG. 1, a package unit 174 and an input/output port 178 is formed over a package substrate 180, and the package unit 174 is surrounded by a ring 182. The package unit 174 includes a semiconductor die 120 and a number of die stacks 130 formed over a dielectric layer 104. The semiconductor die 120 has a different function than the die stack 130. In some embodiments, the semiconductor die 120 is between the two adjacent die stacks 130. In some embodiments, the size of the semiconductor die 120 is greater than the size of the die stack 130.

In some embodiments, the semiconductor die 120 is sawed from a wafer, and may be a "known-good-die". The semiconductor die 120 may be a system-on-chip (SoC) chip. In some other embodiments, the semiconductor die 120 is a system on integrated circuit (SoIC) device that includes two or more chips with integrated functions.

The die stack 130 includes a number of memory dies. The semiconductor die 120 has a different function than each of the plurality of memory dies. The memory dies may include a static random access memory (SRAM) device, a dynamic random access memory (DRAM) device, a high bandwidth memory (HBM) or another memory dies. In some embodiments, the semiconductor die 120 is a system on integrated circuit (SoIC) device, and the die stack 130 is a high bandwidth memory (HBM).

The input/output port 178 is formed adjacent to the package unit 174. The input/output port 178 is configured to receive or send signals from the semiconductor die 120 and the die stacks 130 to the outer environment. The input/output port 178 may be a die.

In some embodiments, the package substrate 180 is a printed circuit board (PCB), a ceramic substrate or another suitable package substrate. The ring 182 is used to protect the package unit 174 and prevent the package unit 174 from being bent.

The ring 182 provide an adequate support function and warpage control. In some embodiments, the ring 182 includes a supportive material such as a metal, a ceramic, or combinations thereof.

The package unit 174 has a width $W_a$ along a vertical direction, and a length $L_a$ along a horizontal direction. In some embodiments, the area ($W_a \times L_a$) of the package unit 174 is in a range from about 1710 mm$^2$ to about 3430 mm$^2$.

Although one semiconductor die 120 is surrounded by four die stacks 130 as shown in FIG. 1, the number of semiconductor dies 120 and the number of die stacks 130 can be adjusted according to actual applications.

Figure 2A:
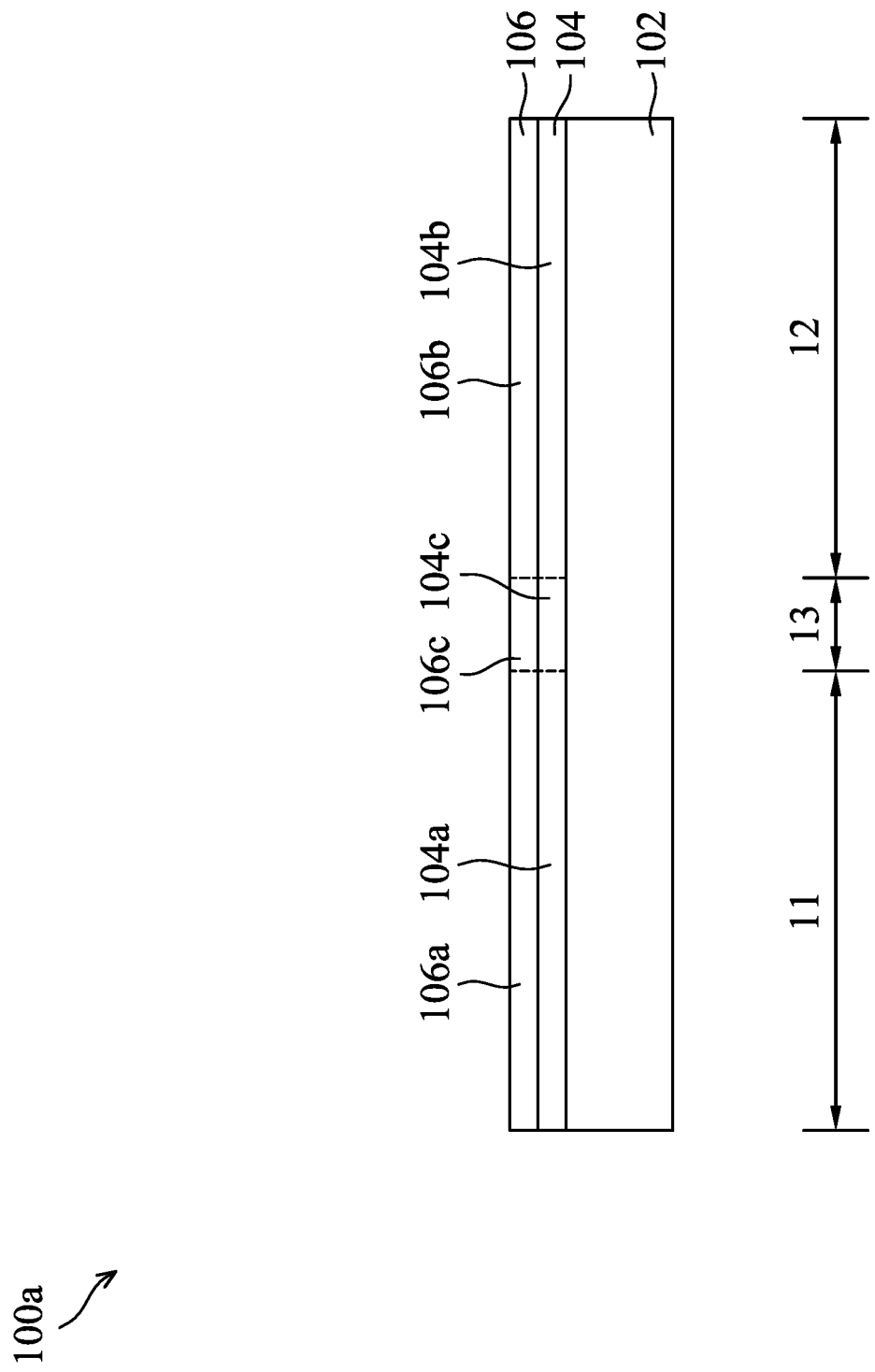
FIGS. 2A-2M show cross-sectional representations of various stages of forming a package structure, in accordance with some embodiments of the disclosure.

FIGS. 2A-2M show cross-sectional representations of various stages of forming the package structure 100a, in accordance with some embodiments of the disclosure. FIG. 2A shows a cross-sectional representation taken along line A-A' of FIG. 1.

As shown in FIG. 2A, the dielectric layer 104 is formed over a carrier substrate 102. A photoresist layer 106 is formed over the dielectric layer 104. The carrier substrate 102 includes a first region 11, a second region 12 and a third region 13 between the first region 11 and the second region 12. The dielectric layer 104 includes a first portion 104a in the first region 11, a second portion 104b in the region 12, and a third portion 104c in the third region 13 between the first region 11 and the second region 12. The photoresist layer 106 includes a first portion 106a in the first region 11, a second portion 106b in the second region 12, and a third portion 106c in the third region 13.

The carrier substrate 102 is configured to provide temporary mechanical and structural support during subsequent processing steps. The carrier substrate 102 includes glass, silicon oxide, aluminum oxide, metal, a combination thereof, and/or the like, in accordance with some embodiments. The carrier substrate 102 includes a metal frame, in accordance with some embodiments.

The dielectric layers 104 may be made of or include one or more polymer materials. The polymer material(s) may include polybenzoxazole (PBO), polyimide (PI), one or more other suitable polymer materials, or a combination thereof. In some embodiments, the polymer material is photosensitive. In some embodiments, some or all of the dielectric layers 104 are made of or include dielectric materials other than polymer materials. The dielectric material may include silicon oxide, silicon carbide, silicon nitride, silicon oxynitride, one or more other suitable materials, or a combination thereof.

Figure 2B:
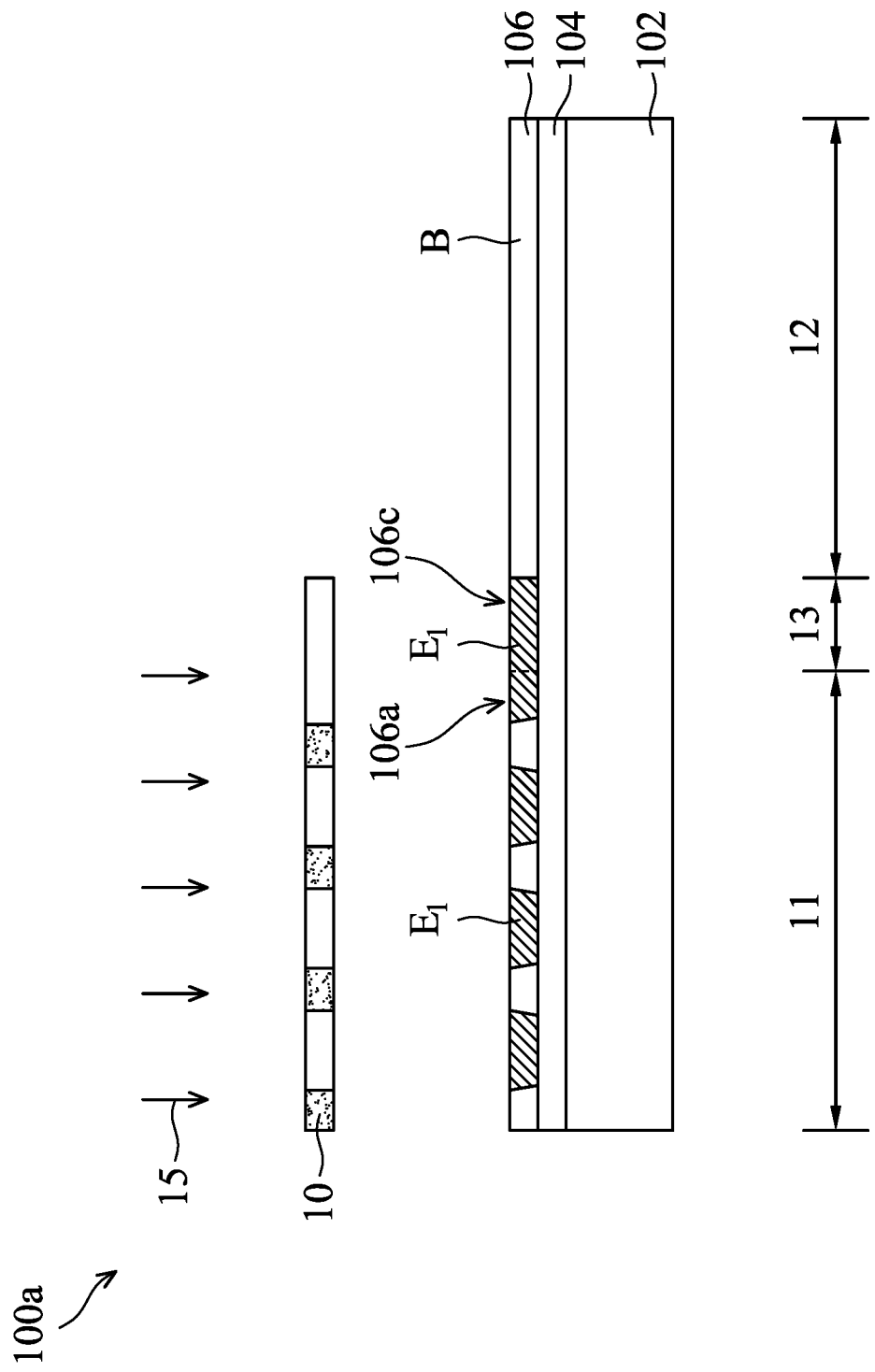

Afterwards, as shown in FIG. 2B, a first mask 10 is disposed over the photoresist layer 106, and a first exposure process 15 is performed on the photoresist layer 106, in accordance with some embodiments of the disclosure. The first mask 10 is disposed over the first region 11 and the third region 13, but not over the second region 12. After the first exposure process 15 is performed, some portions of the photoresist layer 106 are exposed and are marked as single exposed region $E_1$, which includes the third portion 106c and some of the first portion 106a. Some other portions of the photoresist layer 106 are not exposed and are marked as un-exposed region B.

Figure 2C:
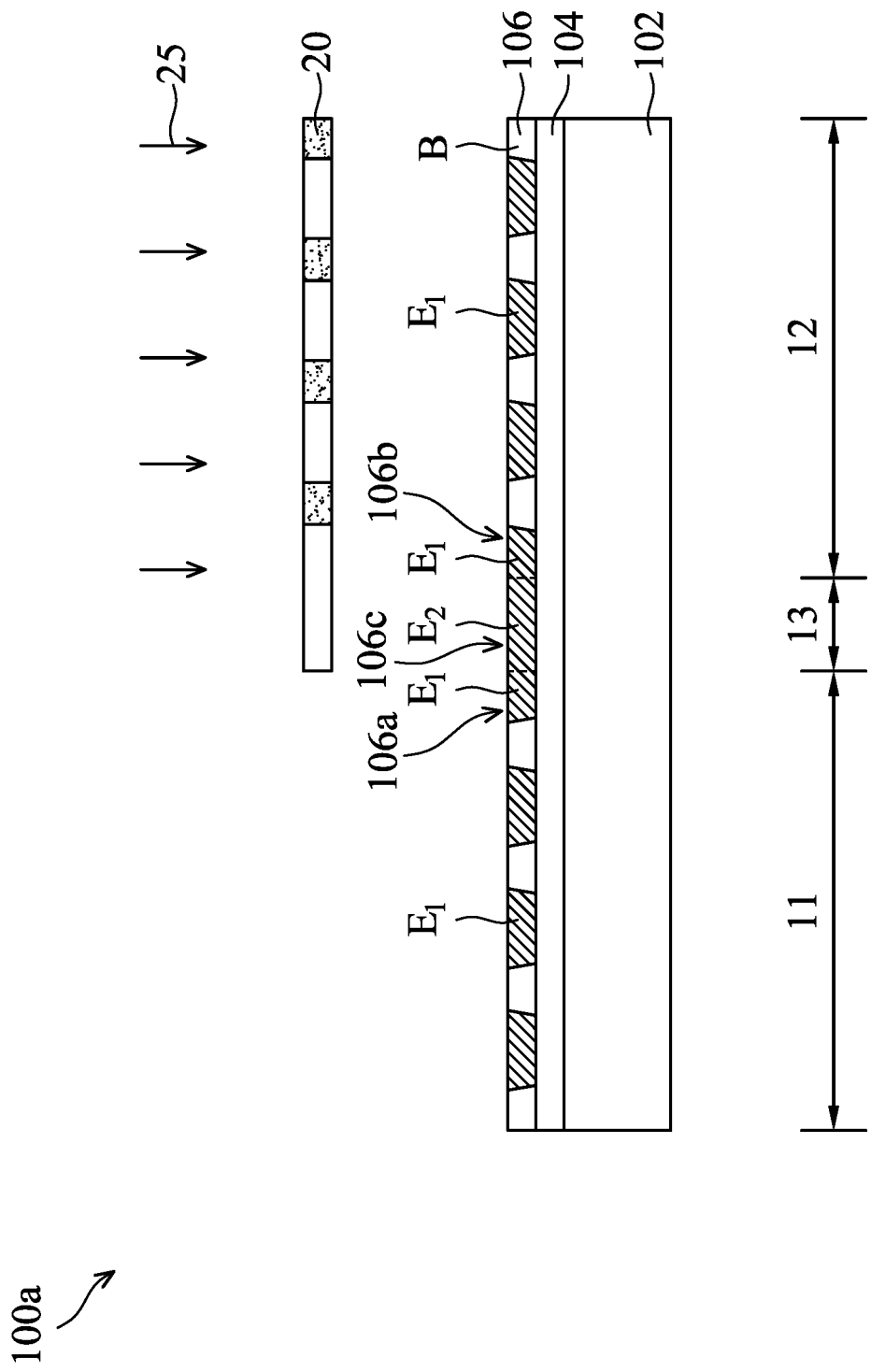

Next, as shown in FIG. 2C, a second mask 20 is disposed over the photoresist layer 106, and a second exposure process 25 is performed on the photoresist layer 106, in accordance with some embodiments of the disclosure. The second mask 20 is disposed over the second region 12 and the third region 13, but not over the first region 11. After the second exposure process 25 is performed, some portions of the photoresist layer 106 are exposed and are marked as the single exposed region $E_1$, which includes the third portion 106c and some of the second portion 106b. Some other portions of the photoresist layer 106 are not exposed and are marked as un-exposed region B. In addition, some portions of the photoresist layer 106 are exposed twice in the third region 13 and are marked as double exposed region $E_2$ (the third portion $P_3$).

The first exposure process 15 and the second exposure process 25 are performed in the same chamber to reduce the fabrication cost and time. In some other embodiments, in addition to the first exposure process 15 and the second exposure process 25, a third exposure process and a fourth exposure process are performed in the same chamber, and then the metal material is developed once to form an conductive line in the redistribution structure.

Figures 1, 3A:
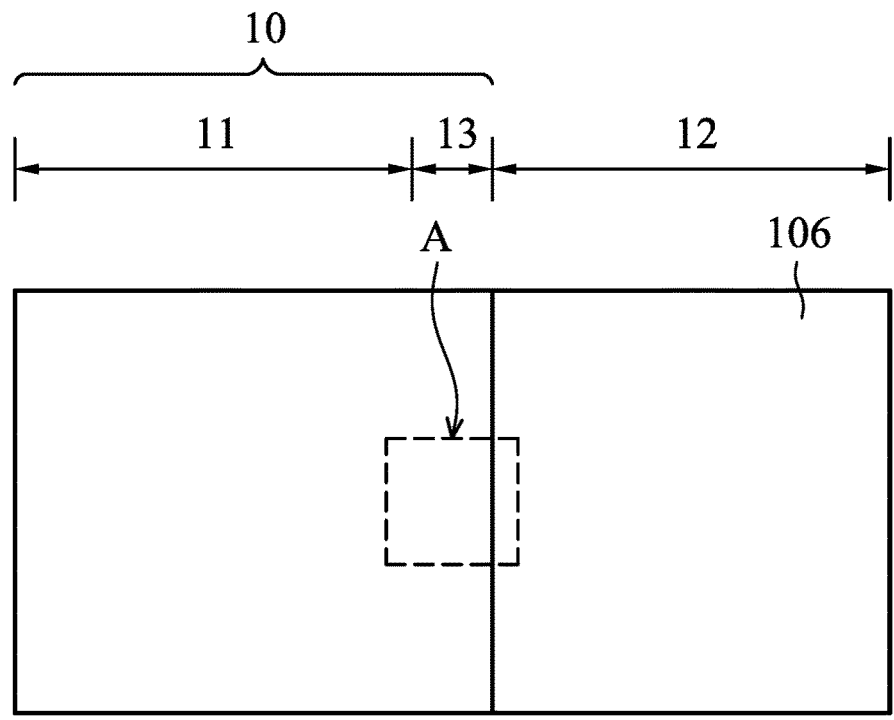
Figures 2, 3A:
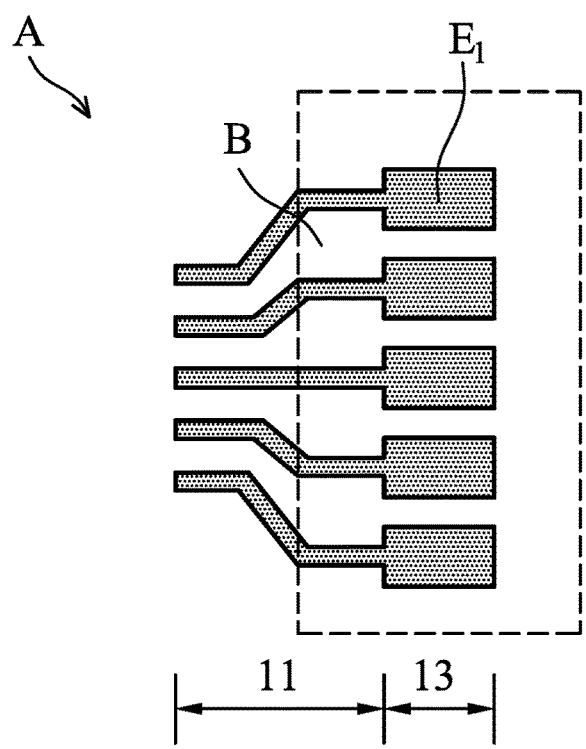
Figures 1, 3B:
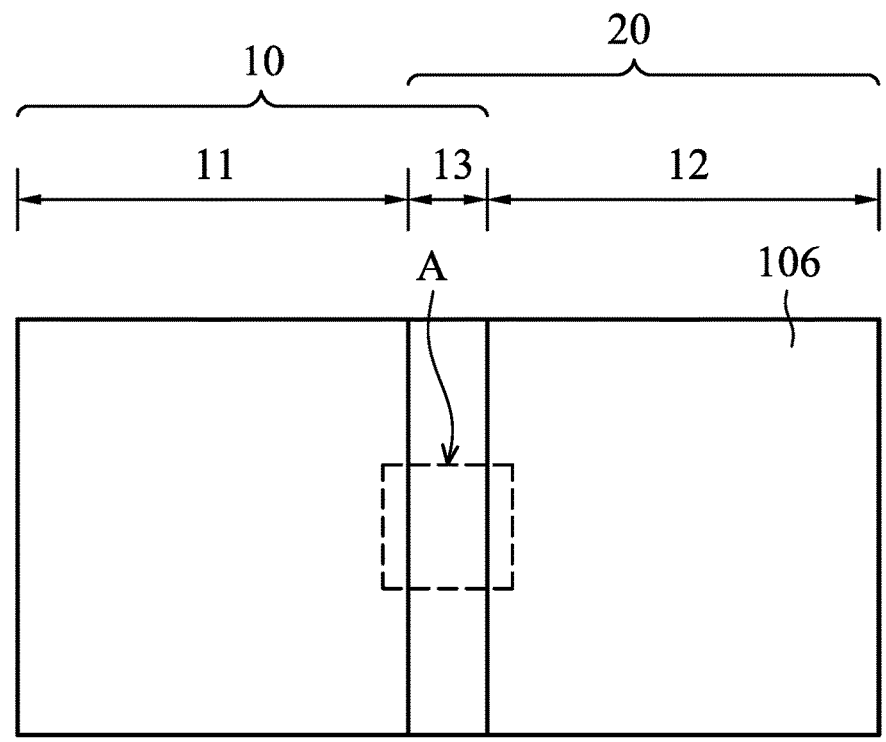
Figures 2, 3B:
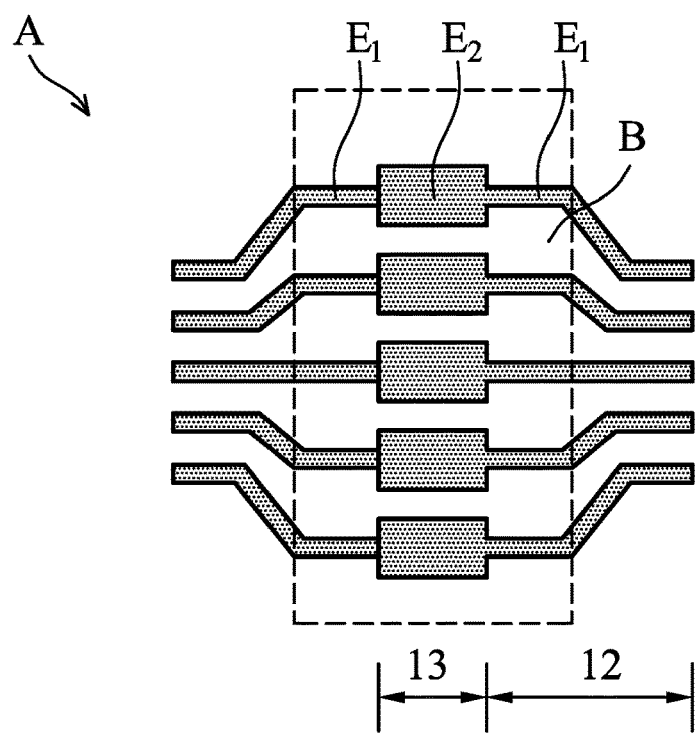

FIG. 3A-1 shows a top-view representation of the exposed regions of the photoresist layer 106 after the first exposure process 15, in accordance with some embodiments of the disclosure. FIG. 3A-2 shows an enlarged representation of the region A in FIG. 3A-1. FIG. 3B-1 shows a top-view representation of the exposed regions of the photoresist layer 106 after the second exposure process 25, in accordance with some embodiments of the disclosure. FIG. 3B-2 shows an enlarged representation of the region A in FIG. 3B-1.

As shown in FIGS. 3A-1 and 3A-2, the single exposed region $E_1$ is in the first region 11 and the third region 13. As shown in FIGS. 3B-1 and 3B-2, the single exposed region $E_1$ is in the second region 12 and the third region 13. Since some portions of the photoresist layer 106 in the third region 13 are exposed twice, and therefore some portions of the photoresist layer 106 are called a double exposed region $E_2$. The width of the double exposed region $E_2$ is greater than the width of the single exposed region $E_1$.

It should be noted that the first mask 10 is limited to the maximum size of the reticle filed. Since the first mask 10 is not large enough to cover the whole area of the photoresist layer 106, and therefore two or more masks may be used to expose the whole area of the photoresist layer 106. In some embodiments, the first mask 10 and the second mask 20 are used to expose whole area of the photoresist layer 106.

Figure 2D:
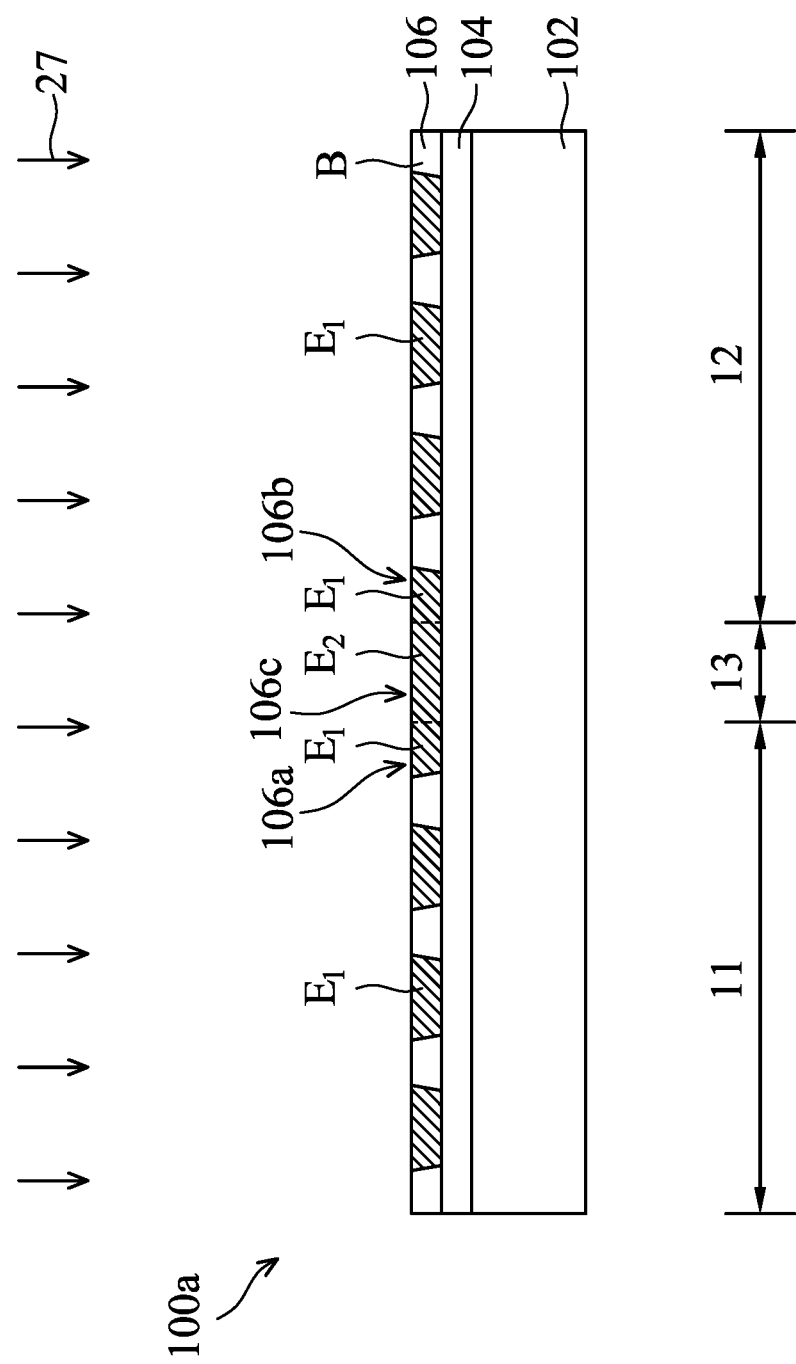

Afterwards, as shown in FIG. 2D, the photoresist layer 106 is developed to form a patterned photoresist layer 106, in accordance with some embodiments of the disclosure. The photoresist layer 106 is developed by performing a development process 27.

There are two types of developing processes: a positive tone development (PTD) process and a negative tone development (NTD) process. The PTD process uses a positive tone developer, which generally refers to a developer that selectively dissolves and removes exposed portions of the photoresist layer 106. The NTD process uses a negative tone developer, which generally refers to a developer that selectively dissolves and removes unexposed portions of the photoresist layer 106. In some embodiments, the PTD developers are aqueous-based developers, such as tetraalkylammonium hydroxide (TMAH). In some embodiments, the NTD developers are organic-based developers, such as n-butyl acetate (n-BA).

Figure 2E:
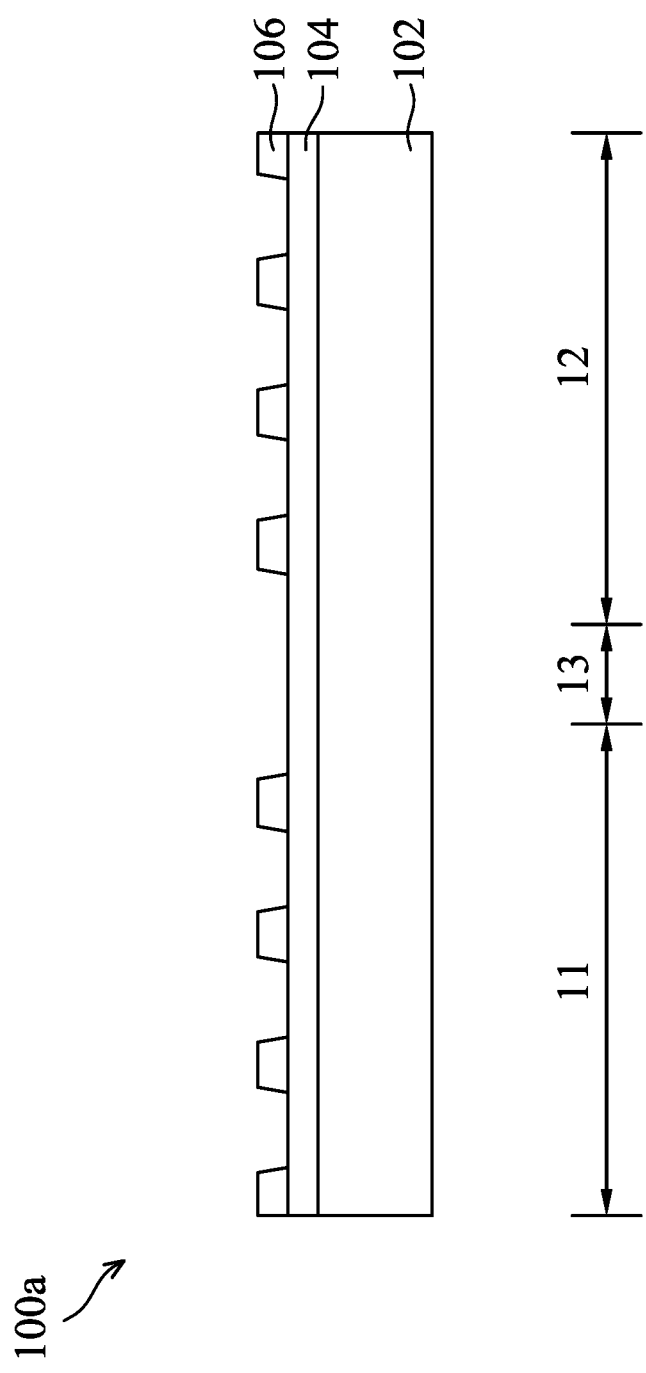

Next, as shown in FIG. 2E, the positive tone developer (PTD) process is performed, the single exposed region E1 and the double exposed region E2 of the resist layer 106 are removed by the developer, and the unexposed region B remains.

Figure 2F:
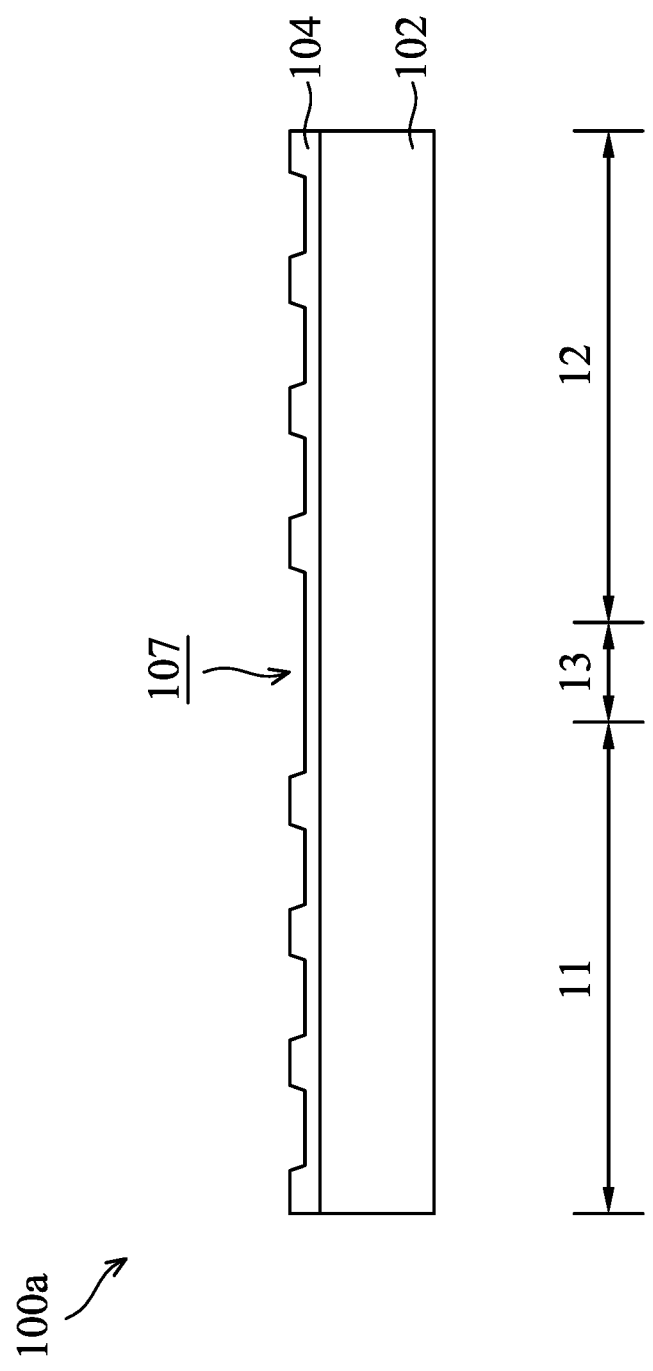

Afterwards, as shown in FIG. 2F, the dielectric layer 104 is patterned by using the patterned photoresist layer 106 as a mask, in accordance with some embodiments of the disclosure. The pattern of the patterned photoresist layer 106 is transferred to the dielectric layer 104. As a result, a trench 107 is formed in the dielectric layer 104.

Figure 2G:
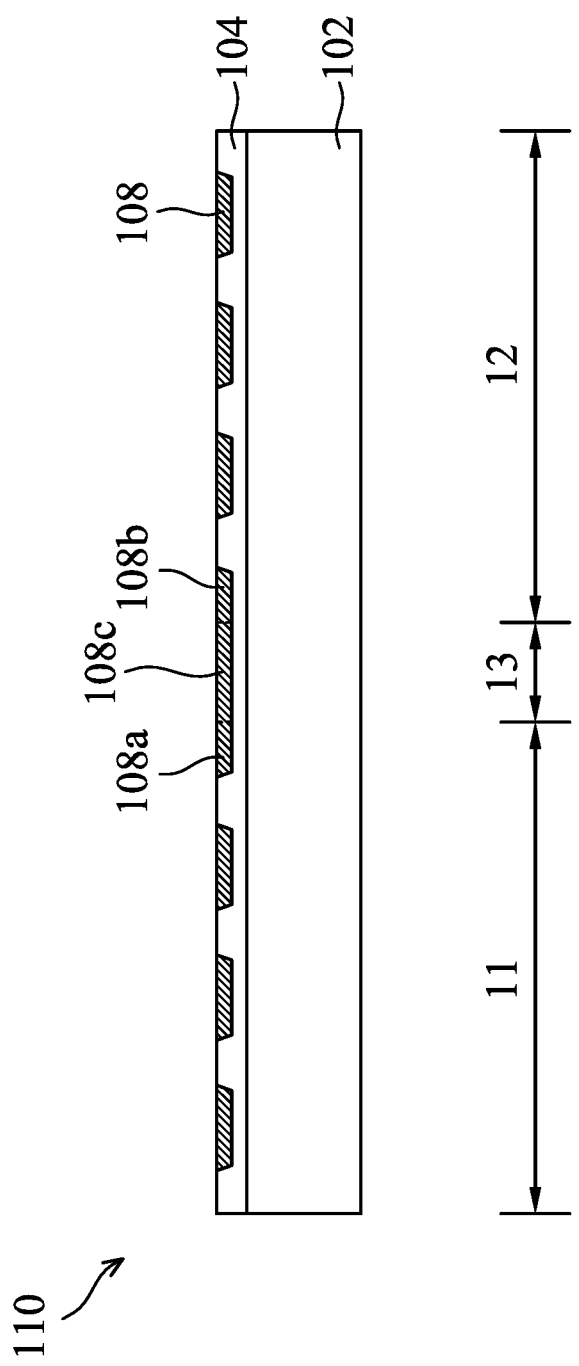

Afterwards, as shown in FIG. 2G, a metal material is formed in the trench 107 to form a conductive layer 108, in accordance with some embodiments of the disclosure. The conductive layer 108 is a part of a redistribution structure 110.

The conductive layer 108 may be made of copper (Cu), copper alloy, aluminum (Al), aluminum alloy, tungsten (W), tungsten alloy, titanium (Ti), titanium alloy, tantalum (Ta) or tantalum alloy. In some embodiments, the conductive layer 108 is formed by an electroplating, electroless plating, printing, a chemical vapor deposition (CVD) process, or a physical vapor deposition (PVD) process.

Figures 1, 3C:
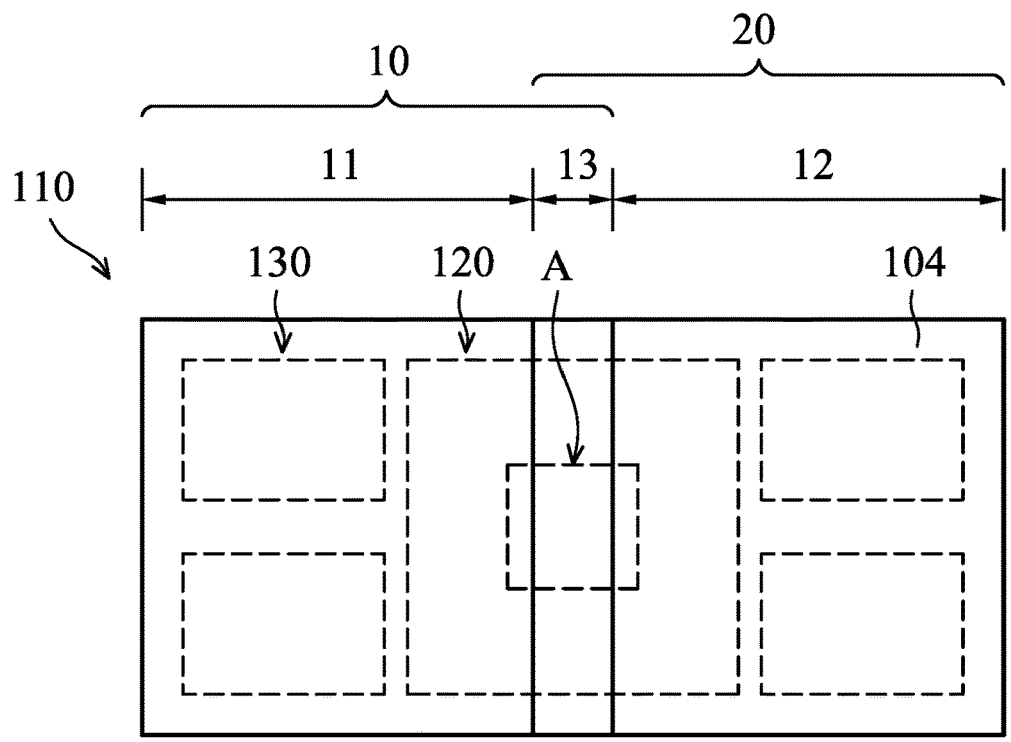
Figures 2, 3C:
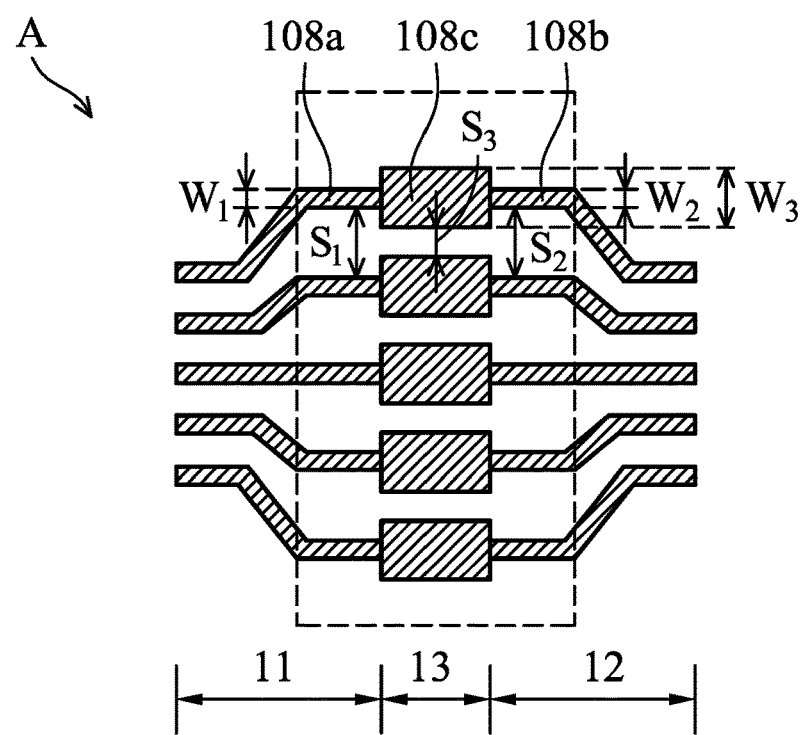

FIG. 3C-1 shows a top-view representation of the conductive layer 108 in the redistribution structure 110 of the package structure 100a, in accordance with some embodiments of the disclosure. FIG. 3C-1 shows the locations of first region 11, the second region 12 and the third region 13 of the dielectric layer 104 in the redistribution structure 110. FIG. 3C-2 shows an enlarged representation of region A of FIG. 3C-1.

As shown in FIGS. 3C-1 and 3C-2, the conductive layer 108 includes a first conductive line 108a in the first region 11, a second conductive line 108b in the second region 12, and an overlapping conductive line 108c in the third region 13. The first conductive line 108a is parallel to the second conductive line 108b. In some embodiments, the first conductive line 108a and the second conductive line 108b are aligned with a straight line. In some other embodiments, the first conductive line 108a and the second conductive line 108b are not aligned.

The first conductive line 108a has a first width $W_1$, the second conductive line 108b has a second width $W_2$, and the overlapping conductive line 108c has a third width $W_3$. The third width $W_3$ is greater than the first width $W_1$ and the second width $W_2$. The first width $W_1$ may be greater than, equal to or smaller than the second width $W_2$. In some embodiments, the third width ($W_3$) of the overlapping conductive line 108c and the first width ($W_1$) of the first conductive line 108a have a relationship shown in equation (I):

$$W_3 = W_1 + y, \text{unit:} \mu m \qquad (I),$$

and y is in a range from about 0.4 μm to about 4 μm.

In some embodiments, the first width ($W_1$) of the first conductive line 108a is about 2 μm, and the third width ($W_3$) of the overlapping conductive line 108c is about 6 μm. In some embodiments, the first width ($W_1$) of the first conductive line 108a is about 2 μm, and the third width ($W_3$) of the overlapping conductive line 108c is about 2.4 μm. When the y value is within the range mentioned above, the accuracy of the alignment between the first conductive line 108a and the second conductive line 108b can be improved, and the reliability of the redistribution structure 110 is improved.

A first space $S_1$ is defined as a distance between two adjacent first conductive lines 108a, there is a second space $S_2$ between two adjacent second conductive lines 108b, and there is a third space $S_3$ between two adjacent overlapping conductive lines 108c. It should be noted that the third space $S_3$ is smaller than the second space $S_2$ and the first space $S_1$. In some embodiments, the first space $S_1$ is equal to the second space $S_2$. In some other embodiments, the first space $S_1$ is smaller than the second space $S_2$.

In addition, the semiconductor die 120 and the die stack 130 are formed over the dielectric layer 104 of the redistribution structure 110. In some embodiments, the overlapping conductive line 108c is directly below the semiconductor die 120. In some other embodiments, the overlapping conductive line 108c is directly below the die stack 130.

Figure 2H:
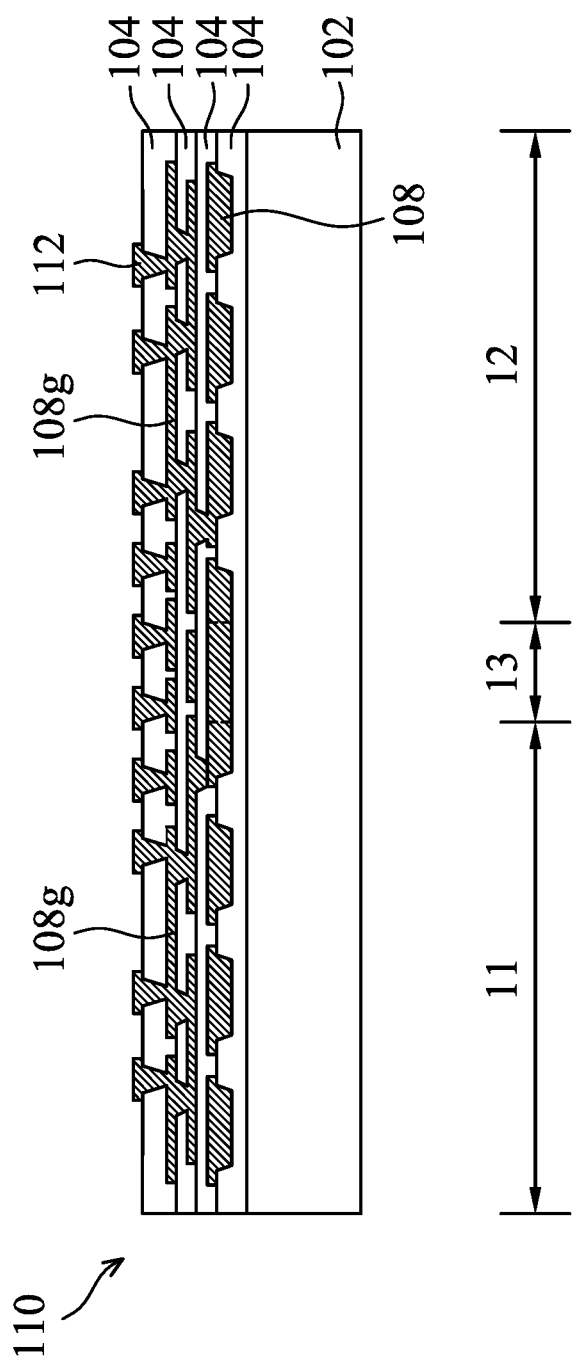

Afterwards, as shown in FIG. 2H, a number of dielectric layers 104 are stacked and a number of conductive layers 108 are formed in the dielectric layer 104 and the adjacent conductive layers 108 are electrically connected to each other, in accordance with some embodiments of the disclosure. Therefore, the redistribution structure 110 is formed over the carrier substrate 102. Each of the conductive layers 108 may be formed by two exposure processes 15, 25 and one development process 27 to form the overlapping conductive line 108c in the third region 13.

Afterwards, a conductive pad 112 protrudes from the top surface of the topmost of the dielectric layers 104. The conductive pad 112 may serve as bonding pads where conductive bumps (such as tin-containing solder bumps) and/or conductive pillars (such as copper pillars) will be formed later. In some embodiments, the conductive pad 112 in the third region 13 is an overlapping pad. The conductive pad 112 in the third region 13 has a greater width than the conductive pad 112 in the first region 11.

It should be noted that, as shown in FIG. 2H, there is a connection metal line 108g is used to electrically connect the semiconductor die 120 and the die stack 130 (formed later). The connection metal line 108g is formed in the redistribution structure 110. In some embodiments, the connection metal lines 108g and the overlapping conductive line 108c are at the same level. In some embodiments, the width of the connection metal line 108g is equal to the first width $W_1$ of the first conductive line 108a. In some embodiments, the connection metal line 108g is not in the third region 13. Since the line space between two adjacent connection metal lines 108g may be too small, there is not enough space to form overlapping connection lines.

Figure 2I:
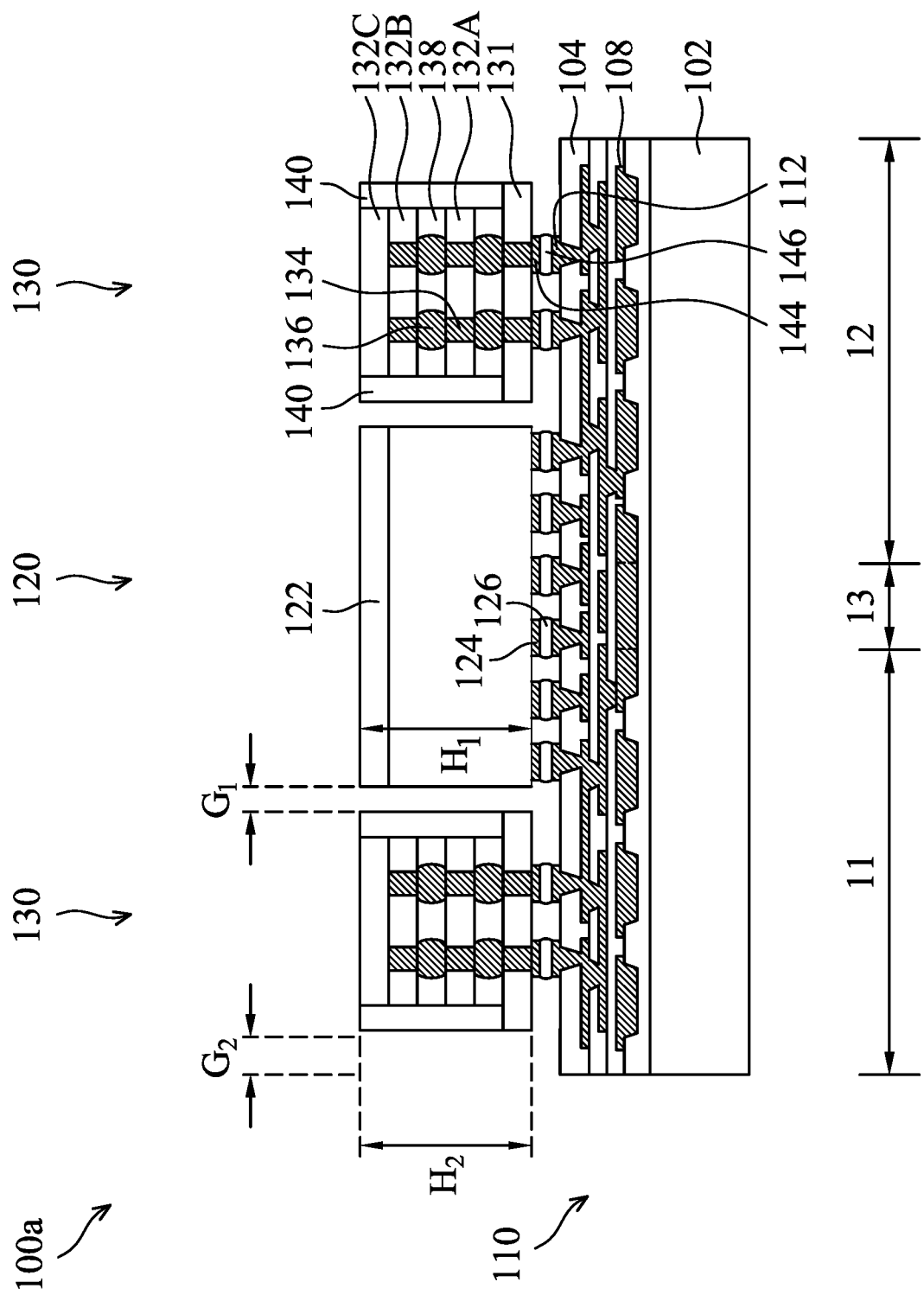

Afterwards, as shown in FIG. 2I, the semiconductor die 120 and the die stack 130 are formed over the carrier substrate 102, in accordance with some embodiments of the disclosure. In some embodiments, the semiconductor die 120 is between two die stacks 130. The semiconductor die 120 is disposed over the redistribution structure 110. The semiconductor die 120 has a substrate 122. In some embodiments, the substrate 122 is silicon (Si) substrate.

In some embodiments, a number of conductive pads 124 are formed below the semiconductor die 120, and each of the conductive pads 124 is bonded to the conductive pad 112 through a conductive connector 126.

The conductive pads 124 are made of metal materials, such as copper (Cu), copper alloy, aluminum (Al), aluminum alloy, tungsten (W), tungsten alloy, titanium (Ti), titanium alloy, tantalum (Ta) or tantalum alloy. In some embodiments, the conductive pad 124 is formed by an electroplating, electroless plating, printing, a chemical vapor deposition (CVD) process, or a physical vapor deposition (PVD) process. The conductive connector 126 is made of solder materials, such as tin (Sn), SnAg, SnPb, SnAgCu, SnAgZn, SnZn, SnBiIn, SnIn, SnAu, SnPb, SnCu, SnZnIn, SnAgSb or another applicable material. In some embodiments, the conductive connector 126 is formed by electroplating, electroless plating, printing, a chemical vapor deposition (CVD) process, or a physical vapor deposition (PVD) process.

The die stack 130 is disposed over the redistribution structure 110. The die stack 130 includes a number of semiconductor dies 132A, 132B, 132C. In some embodiments, the semiconductor dies 132A, 132B, 132C are memory dies. The number of semiconductor dies 132A, 132B, 132C are not limited to two, and the number can be adjusted according to actual application.

The semiconductor dies 132A, 132B, 132C are stacked on a buffer die (or base die) 131 that performs as a logic circuit. The semiconductor dies 132A, 132B, 132C are bonded to each other by a number of bonding structures 136. A number of through substrate vias (TSVs) 134 are formed in the semiconductor dies 132A, 132B, 132C. The signal between the semiconductor dies 132A, 132B, 132C may be transferred through the through substrate vias (TSVs) 134 and the bonding structures 136. An underfill layer 138 is formed between the bonding structures 136.

In some embodiments, a number of conductive pads 144 are formed on the die stack 130, and each of the conductive pads 144 is bonded to the conductive pad 112 of the redistribution structure 110 through a conductive connector 146.

The conductive pads 144 are made of metal materials, such as copper (Cu), copper alloy, aluminum (Al), aluminum alloy, tungsten (W), tungsten alloy, titanium (Ti), titanium alloy, tantalum (Ta) or tantalum alloy. In some embodiments, the conductive pad 144 is formed by an electroplating, electroless plating, printing, a chemical vapor deposition (CVD) process, or a physical vapor deposition (PVD) process.

The conductive connector 146 is made of solder materials, such as tin (Sn), SnAg, SnPb, SnAgCu, SnAgZn, SnZn, SnBiIn, SnIn, SnAu, SnPb, SnCu, SnZnIn, SnAgSb or another applicable material. In some embodiments, the conductive connector 146 is formed by electroplating, electroless plating, printing, a chemical vapor deposition (CVD) process, or a physical vapor deposition (PVD) process.

The semiconductor die 120 has a first height $H_1$ along a vertical direction, and the die stack 130 has a second height $H_2$ along the vertical direction. The first height $H_1$ is substantially equal to the second height $H_2$. In some embodiments, the first height $H_1$ of the semiconductor die 120 is in a range from about 750 μm to about 850 μm. There is a first gap $G_1$ between the semiconductor die 120 and the die stack 130. In some embodiments, the first gap $G_1$ is in a range from about 70 μm to about 190 μm. There is a second gap $G_2$ between the edge of the die stack 130 and the edge of the redistribution structure 110. In some embodiments, the second gap $G_2$ is in a range from about 600 μm to about 800 μm.

Figure 2J:
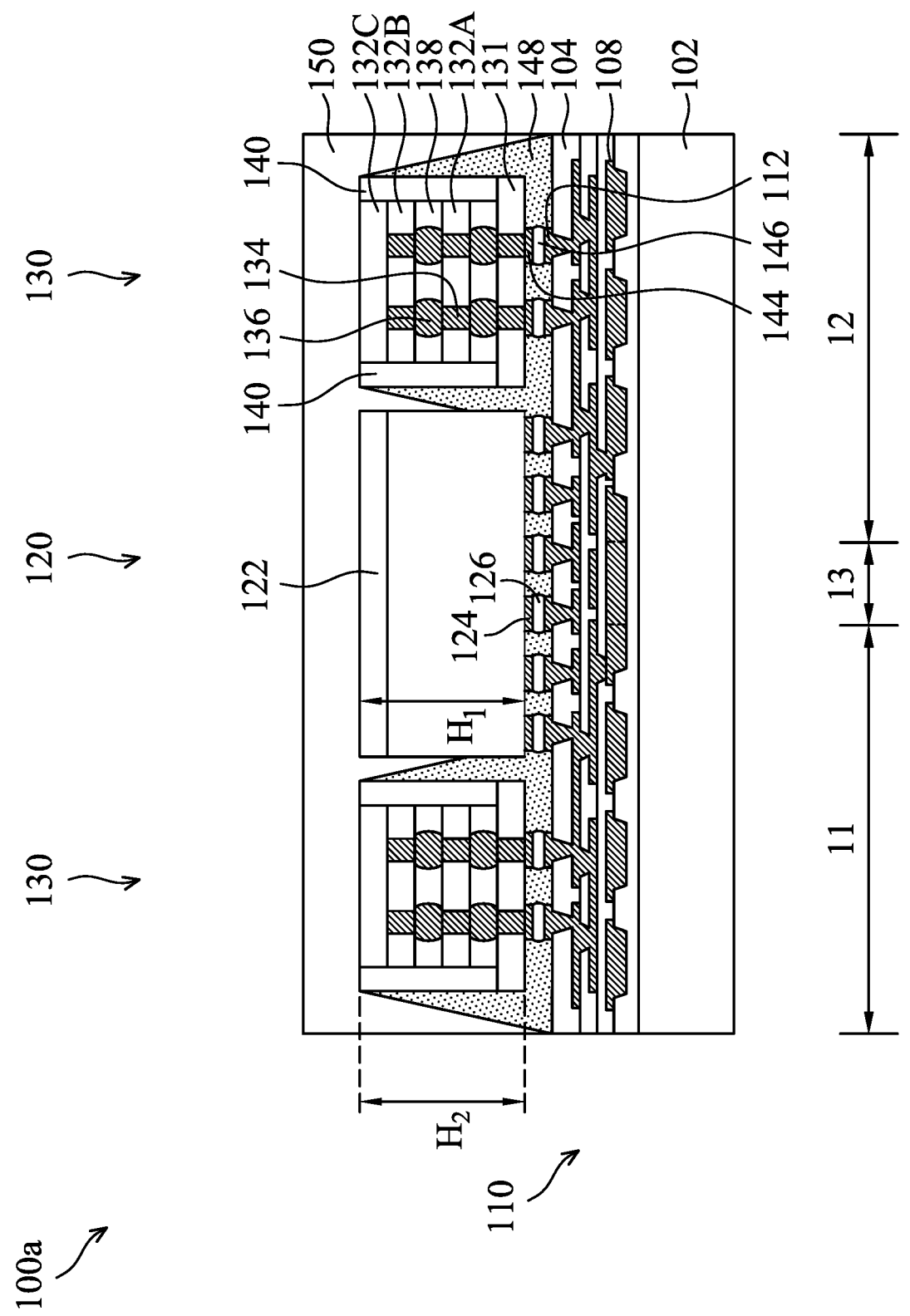

Afterwards, as shown in FIG. 2J, an underfill layer 148 is formed between the semiconductor die 120, the die stack 130 and the redistribution structure 110, in accordance with some embodiments of the disclosure.

The underfill layer 148 surrounds and protects the conductive connectors 126 and 146. In some embodiments, the underfill layer 148 is in direct contact with the conductive connectors 126 and 146.

In some embodiments, the underfill layer 148 is made of or includes a polymer material. The underfill layer 148 may include an epoxy-based resin. In some embodiments, the underfill layer 148 includes fillers dispersed in the epoxy-based resin.

In some embodiments, the formation of the underfill layer 148 involves an injecting process, a spin-on process, a dispensing process, a film lamination process, an application process, one or more other applicable processes, or a combination thereof. In some embodiments, a thermal curing process is used during the formation of the underfill layer 148.

Afterwards, a package layer 150 is formed over the underfill layer 148. There is an interface between the underfill layer 148 and the package layer 150, and the interface is lower than the top surface of the semiconductor die 120. The package layer 150 surrounds and protects the semiconductor die 120 and the die stack 130. In some embodiments, the package layer 150 is in direct contact with a portion of the semiconductor die 120, a portion of the die stack 130.

The package layer 150 is made of a molding compound material. The molding compound material may include a polymer material, such as an epoxy-based resin with fillers dispersed therein. In some embodiments, a liquid molding compound material is applied over the semiconductor die 120, the die stack 130. The liquid molding compound material may flow into a space between the semiconductor die 120, the die stack 130. A thermal process is then used to cure the liquid molding compound material and to transform it into the package layer 150.

Figure 2K:
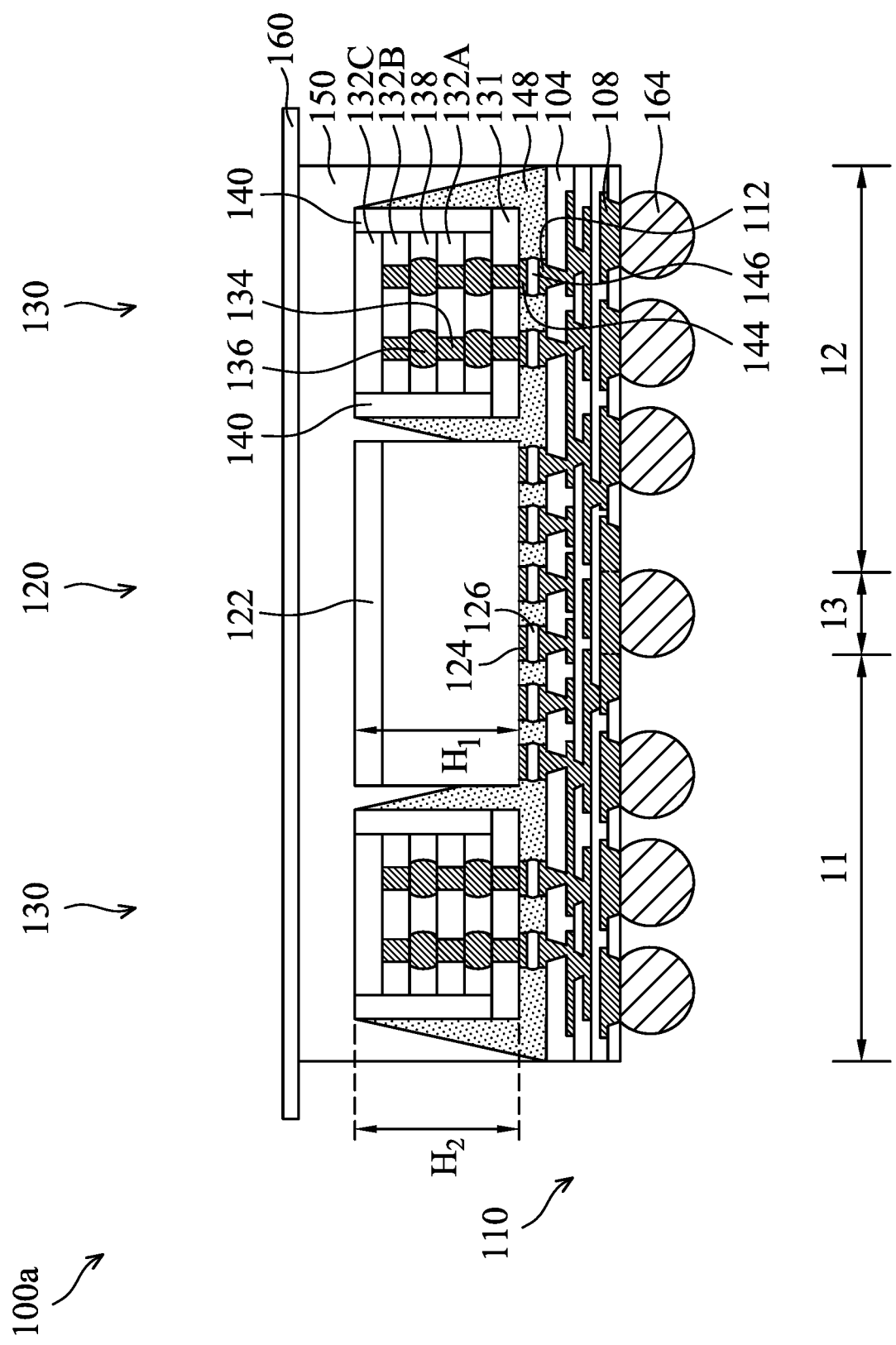

Afterwards, as shown in FIG. 2K, a frame tape 160 is formed over the package layer 150, in accordance with some embodiments of the disclosure. Afterwards, the carrier substrate 102 is removed.

The frame tape 160 is used as a temporary substrate. The frame tape 160 substrate provides mechanical and structural support during subsequent processing steps, such as those described in more detail later. In some embodiments, the semiconductor die 130 and the die stack 130 adhere to the frame tape 160. For example, the package layer 150 is attached to the frame tape 160 through an adhesive layer (not shown). The adhesive layer is used as a temporary adhesive layer.

Next, a portion of the redistribution structure 110 is removed. As a result, the conductive layer 108 of the redistribution structure 110 is exposed. Afterwards, a number of conductive connectors 164 are formed over the exposed conductive layer 106 of the redistribution structure 110. The conductive connectors 164 are electrically connected to the conductive layer 108 of the redistribution structure 110.

It should be noted that the overlapping conductive line 108c of the redistribution structure 110 is in direct contact with the conductive connectors 164. In some embodiments, there is no through via between the overlapping conductive line 108c and the conductive connectors 164.

In some embodiments, the conductive connectors 164 are referred to as controlled collapse chip connection (C4) bumps. In some other embodiments, the conductive connectors 164 is micro bumps, electroless nickel-electroless palladium-immersion gold technique (ENEPIG) formed bumps, ball grid array (BGA) bumps, or the like.

It should be noted that the conductive connectors 126 are formed on the top surface of the redistribution structure 110, and the conductive connectors 164 are formed on the bottom surface of the redistribution structure 110. There is a first gap between two adjacent conductive connectors 126, and a second gap between two adjacent conductive connectors 164. The second gap is greater than the first gap. Accordingly, the redistribution structure 110 enables the fan-out connection. The term "fan-out" means that the I/O pads on a die can be redistributed to a greater area than the die itself, and hence the number of I/O pads packed on the surfaces of the dies can be increased.

Figure 2L:
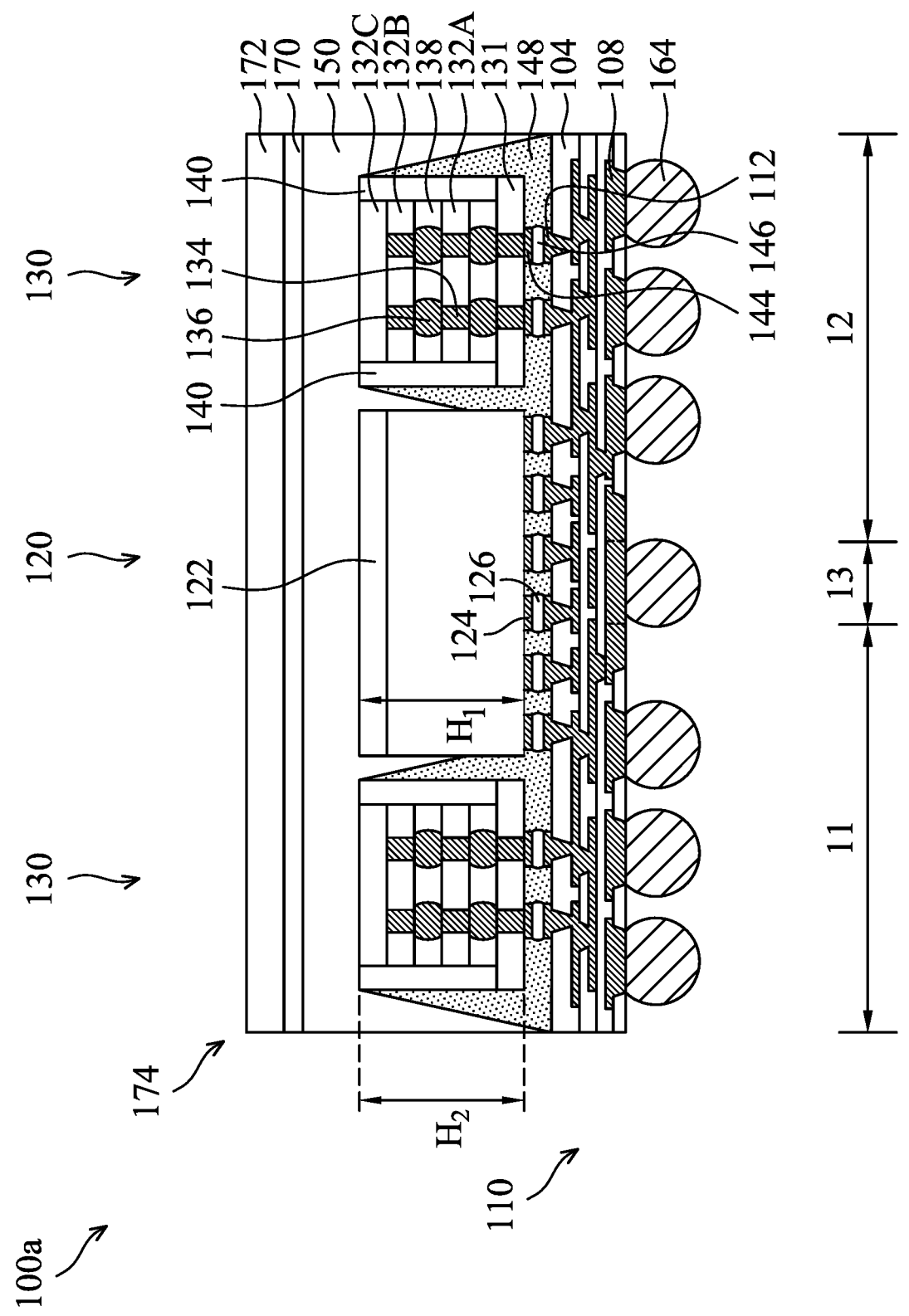

Afterwards, as shown in FIG. 2L, an adhesive layer 170 is formed over the package layer 150, in accordance with some embodiments of the disclosure.

The adhesive layer 170 is formed over the semiconductor die 120 and the die stack 130. The adhesive layer 170 is made of a polymer having a good thermal conductivity. In some embodiments, the adhesive layer 170 includes thermal interface material (TIM).

Next, a lid structure 172 is formed over the adhesive layer 170 to form the package unit 174. Accordingly, the heat generated by the semiconductor die 120 and the die stack 130 may dissipate to the lid structure 172, and then dissipate to the external environment. The lid structure 172 is made of a conductive material (such as metal) or a non-conductive material (such as silicon, glass or ceramic).

Figure 2M:
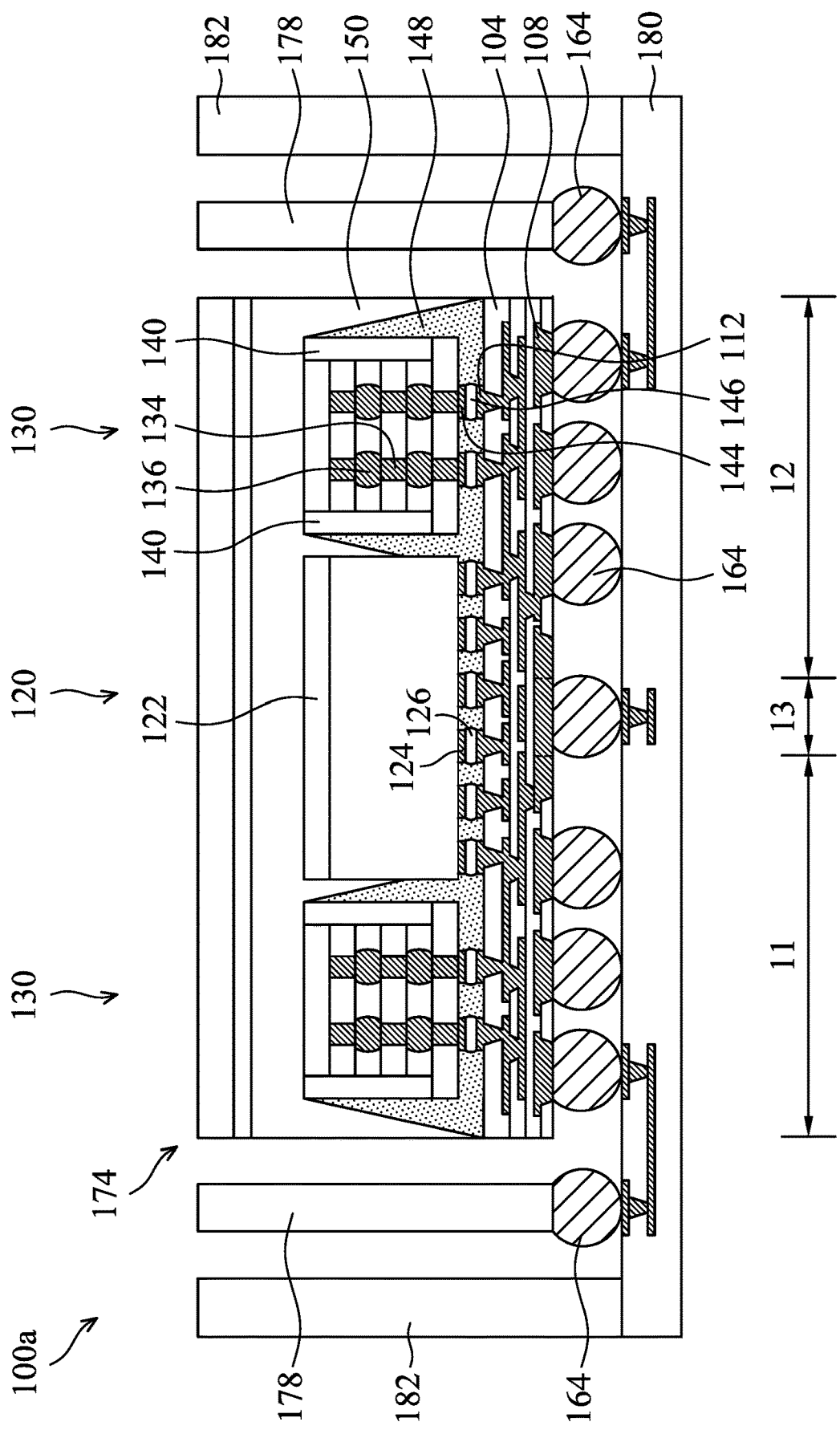
Figure 2M:
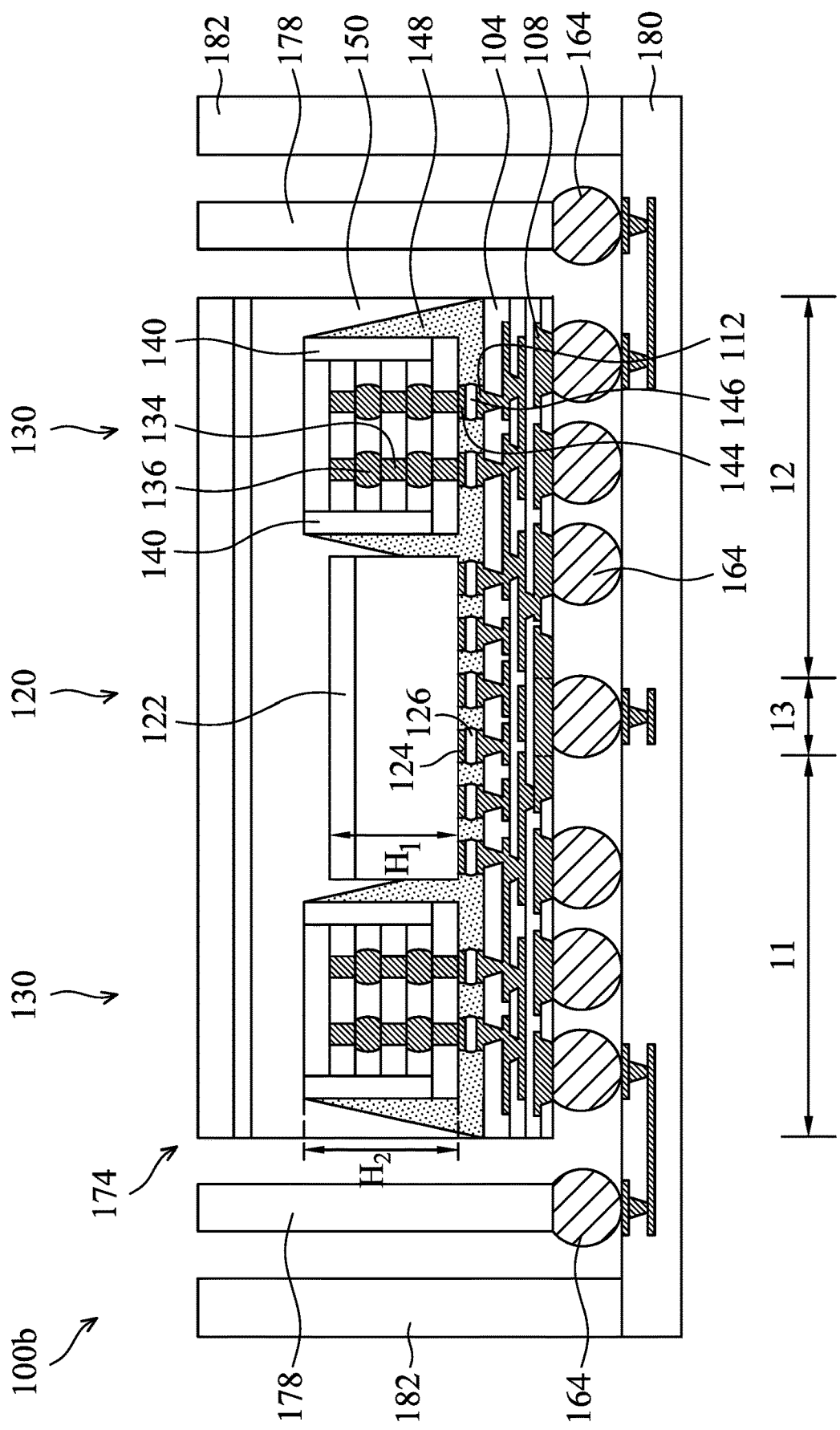

Afterwards, as shown in FIG. 2M, the package unit 174 is bonded to the package substrate 180 through the conductive connectors 164, in accordance with some embodiments. In addition, the input/output port 178 is bonded to the package substrate 180 through the conductive connectors 164. In some embodiments, the package substrate 180 is a printed circuit board (PCB), a ceramic substrate or another suitable package substrate.

The redistribution structure 110 is used as fan out electrical connection to connect the signals of the semiconductor die 120 and the die stack 130 to the package substrate 180. The semiconductor die 120 and the die stack 130 are electrically connected to the input/output port 178 by the conductive layers and vias in the package substrate 180.

It should be noted that there are no through substrate vias (TSV) formed in the carrier substrate 102. A TSV may cause unwanted insertion loss. The "insertion loss" is the loss of signal power resulting from the insertion of a device in a transmission line. The disclosure provides a method of forming the package structure 100a without using any interposer substrate (with TSV) to prevent insertion loss.

Furthermore, if an interposer substrate made of silicon is used in the package structure, the coefficient of thermal expansion (CTE) of the silicon is mismatched with the CTE of the die stack 130. The redistribution structure 110 including the dielectric layer 104 and the conductive layer 108 has a CTE which is close to the CTE of the die stack 130. The warpage caused by the CTE mismatch between the die stack 130 and the interposer substrate is reduced by replacing the interposer substrate with the redistribution structure 110.

Furthermore, the package structure 100a can be applied to a high computational power device due to multiple die stacks 130 being integrated adjacent to the semiconductor die 120. More multiple die stacks 130 are used, and more higher capacity memories can be obtained. In some embodiments, when the die stacks 130 are high-bandwidth memories (HBM), the memory bandwidth may be greater than 2 TB. Therefore, the package structure can be applied in artificial intelligence (AI) applications.

FIG. 2M' shows a cross-sectional representation of a package structure 100b, in accordance with some embodiments of the disclosure. The package structure 100b is similar to, or the same as, the package structure 100a shown in FIG. 2M, except that the semiconductor die 120 and the die stack 130 have different heights. The processes and materials used to form the semiconductor device structure 100b may be similar to, or the same as, those used to form the semiconductor device structure 100a and are not repeated herein.

The semiconductor die 120 has a first height $H_1$ along a vertical direction, and the die stack 130 has a second height $H_2$ along the vertical direction. The second height $H_2$ is greater than the first height $H_1$. In some embodiments, the first height $H_1$ of the semiconductor die 120 is in a range from about 750 μm to about 850 μm. In some embodiments, the second height $H_2$ of the die stack 130 is in a range from about 900 μm to about 1000 μm. In some embodiments, a height difference ($\Delta H = H_2 - H_1$) between the second height and the first height $H_1$ is in a range from about 50 μm to about 150 μm. When the height difference is within the range mentioned above, the package structure 100b has good heat dissipation efficiency.

In addition, since two die stacks 130 are protected by the package layer 150, the top surfaces of the die stacks 130 are not exposed by the planarization process, such as CMP process. The two die stacks 130 are prevented from being damaged during the planarization process. Therefore, the quality and reliability of the package structure 100b are improved.

Figure 4A:
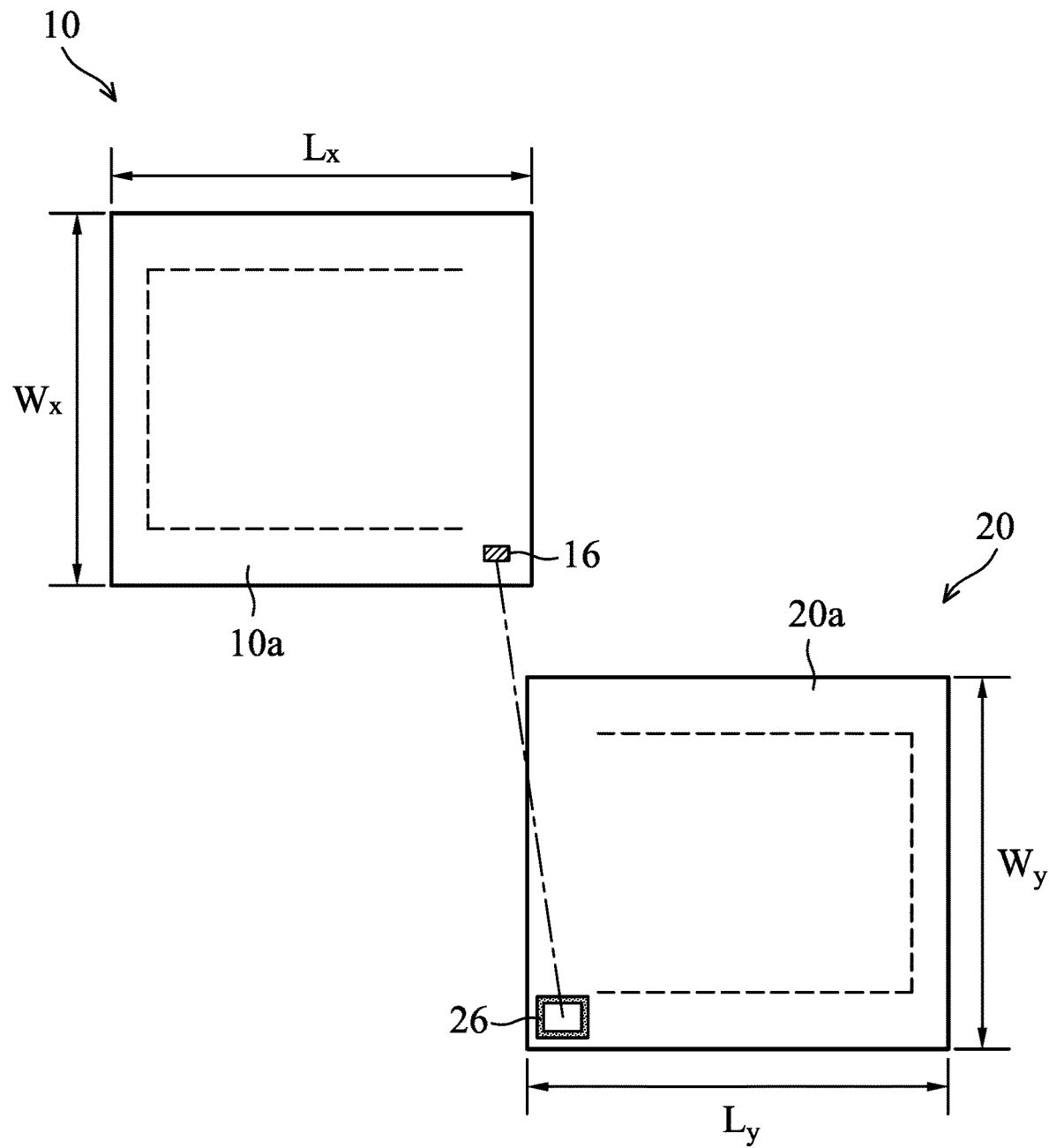
FIG. 4A shows a top-view representation of a first mask and a second mask, in accordance with some embodiments of the disclosure.

FIG. 4A shows a top-view representation of the first mask 10 and the second mask 20, in accordance with some embodiments of the disclosure.

As shown in FIG. 4A, the first mask 10 has a length Lx and a width Wx. The second mask 20 has a length Ly and a width Wy. The first mask 10 has an area up to 52 mm×34 mm, which is the maximum size of one reticle. The second mask 20 has an area up to 52 mm×34 mm, which is the maximum size of one reticle. In some embodiments, the length Lx of the first mask 10 is in a range from about 1 mm to 52 mm, and the length Ly of the second mask 20 is in a range from 1 mm to 52 mm. In some other embodiments, the width Wx of the first mask 10 is in a range from about 1 mm to about 34 mm, and the width Wy of the second mask 20 is in a range from about 1 mm to about 34 mm.

A first mark 16 is formed in the first mask 10, and a second mark 26 is formed in the second mask 20. The first mark 16 and the second mark 26 are used as monitoring patterns to make sure the accuracy of the alignment between the first mask 10 and the second mask 20. In some embodiments, the first mark 16 has a rectangular solid pattern. In some embodiments, the second mark 26 has a rectangular frame pattern.

In the first mask 10, a first scribe line 10a is located at an outer region of the first mask 10, but not at the overlapping region 13. In addition, a second scribe line 20a is located at an outer region of the second mask 20, but not at the overlapping region 13. It should be noted that the first scribe line 10a and the second scribe line 20a are part of the first mask 10 and the second mask 20, respectively. The first scribe line 10a and the second scribe line 20a are configured to define the locations of the scribe lines in the dielectric layer 104. In some embodiments, the electrical monitoring patterns, overlapping alignment patterns are formed in the first scribe line 10a and the second scribe line 20a. In some embodiments, the width of the first scribe line 10a is in a range from about 50 μm to about 220 μm. In some embodiments, the width of the second scribe line 20a is in a range from about 50 μm to about 220 μm.

Figure 4B:
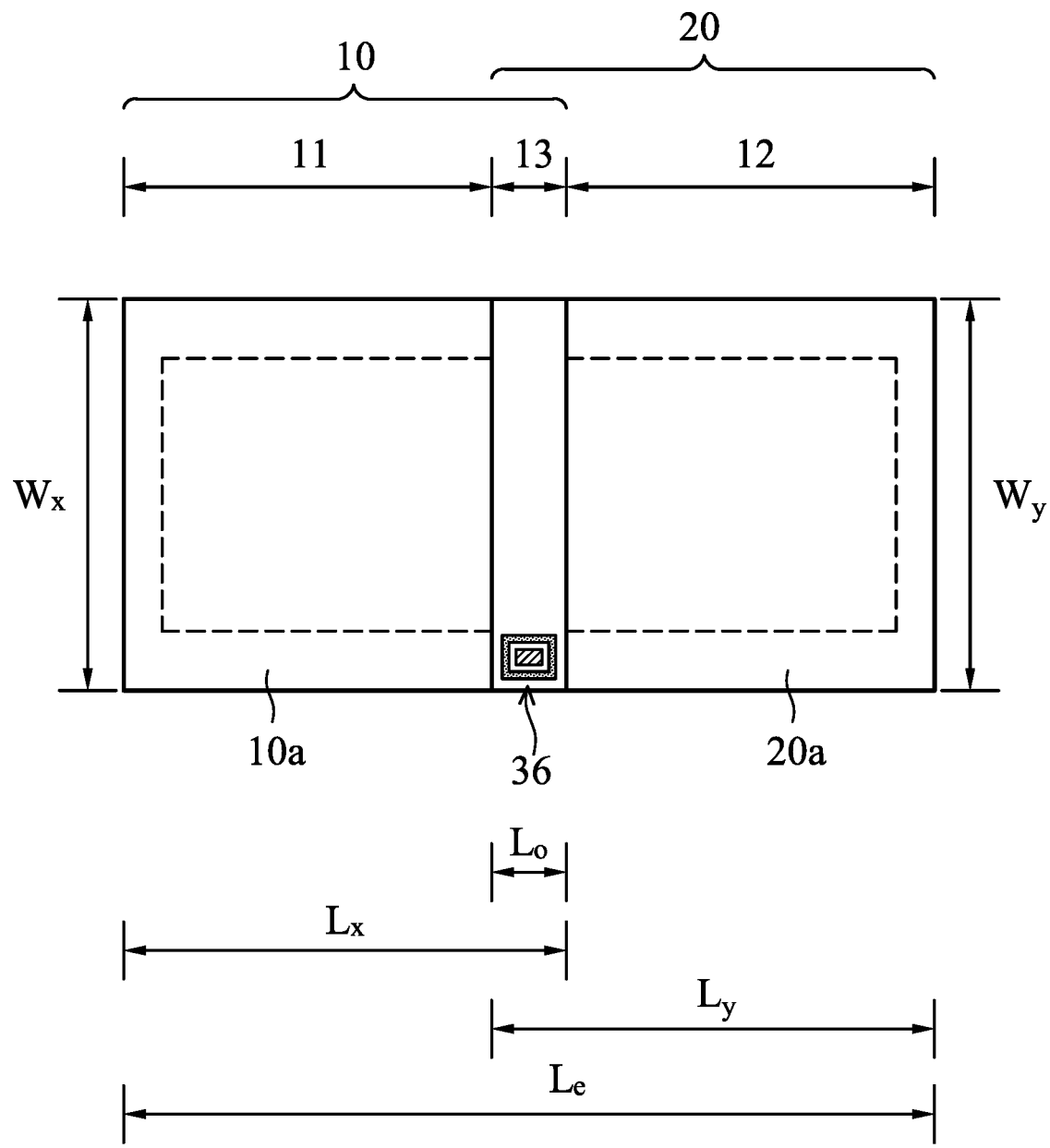
FIG. 4B shows a top-view representation of overlapping between the first mask and the second mask, in accordance with some embodiments of the disclosure.

FIG. 4B shows a top-view representation of overlapping between the first mask 10 and the second mask 20, in accordance with some embodiments of the disclosure.

As shown in FIG. 4B, the first mark 16 is overlapped with the second mark 26 to show a specific pattern. When the first mask 10 and the second mask 20 are aligned with each other, the first mark 16 is surrounded by the second mark 26, and the rectangular solid pattern of the first mark 16 is not in contact with the frame shape of the second mark 26. If the first mask 10 and the second mask 20 are misaligned, and the first mark 16 may be in contact with the shape of the second mark 26.

As mentioned above, the first mask 10 is disposed over the first region 11 and the third region 13 of the carrier substrate 102. The second mask 20 is disposed over the second region 12 and the third region 13. The third region 13 is an overlapping portion of the first mask 10 and the second mask 20. The overlapping portion between the first mask 10 and the second mask 20 has an overlapping length Lo. The exposure length Le is defined as the sum of the length Lx of the first mask 10 and the length Ly of the second mask 20 minus the overlapping length Lo (Le=Lx+Ly−Lo). In some embodiments, the third region 13 (the overlapping portion between the first mask 10 and the second mask 20) is substantially at the middle of the exposure length Le. In some embodiments, the overlapping length Lo is in a range from about 80 nm to about 150 nm. Furthermore, the first scribe line 10a and the second scribe line 20a are not formed in the third region 13 (or overlapping region).

Figure 4C:
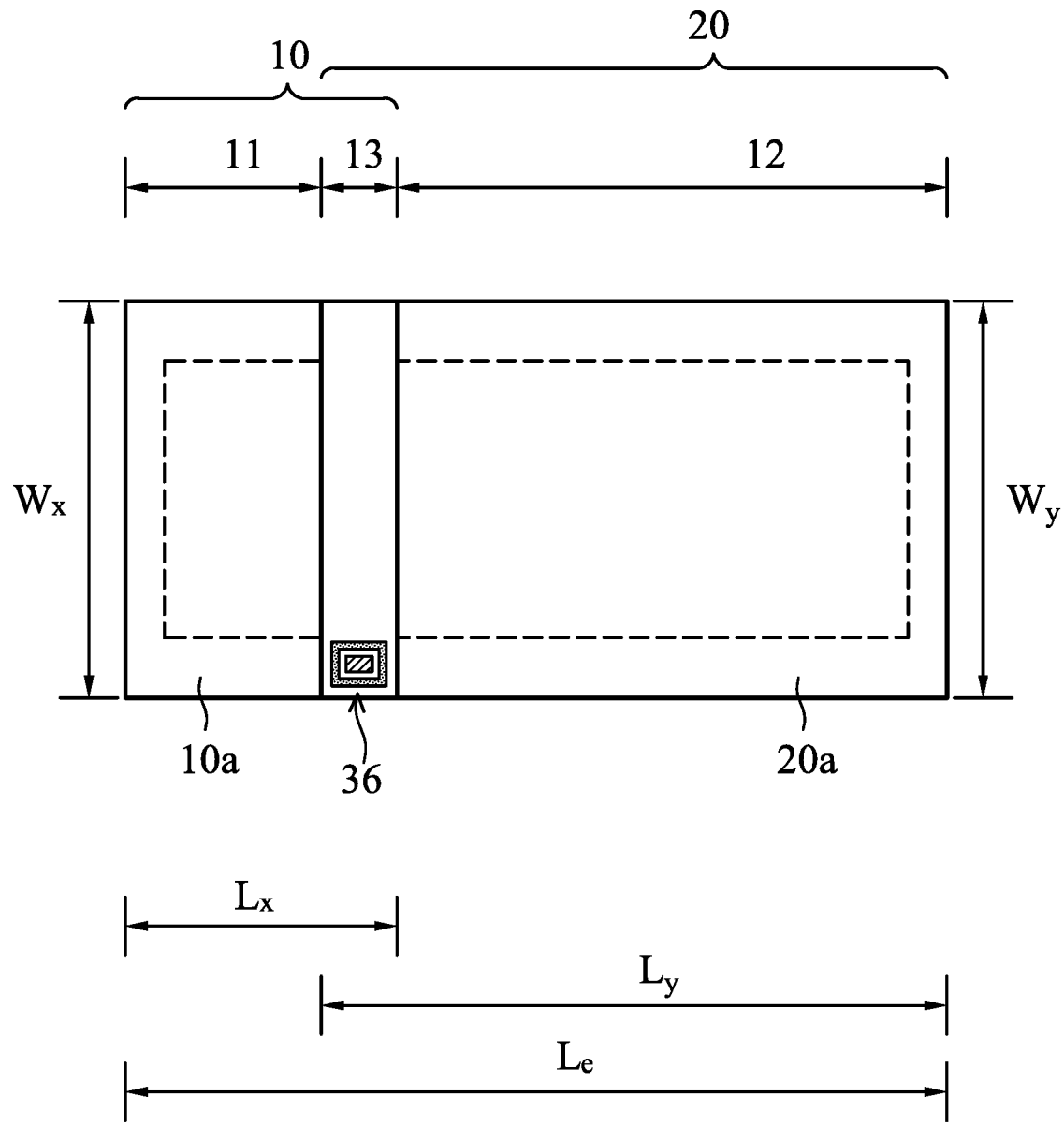
FIG. 4C shows a top-view representation of overlapping between the first mask and the second mask, in accordance with some embodiments of the disclosure.

FIG. 4C shows a top-view representation of overlapping between the first mask 10 and the second mask 20, in accordance with some embodiments of the disclosure. The difference between FIG. 4C and FIG. 4B is that the third region 13 of FIG. 4C is not at middle of the overall area of overlap of the first mask 10 and the second mask 20.

As shown in FIG. 4C, the size of the second mask 20 is greater than the size of the first mask 10. The third region 13 is closer to the left side, and is not at the middle of the exposure length Le.

Figure 4D:
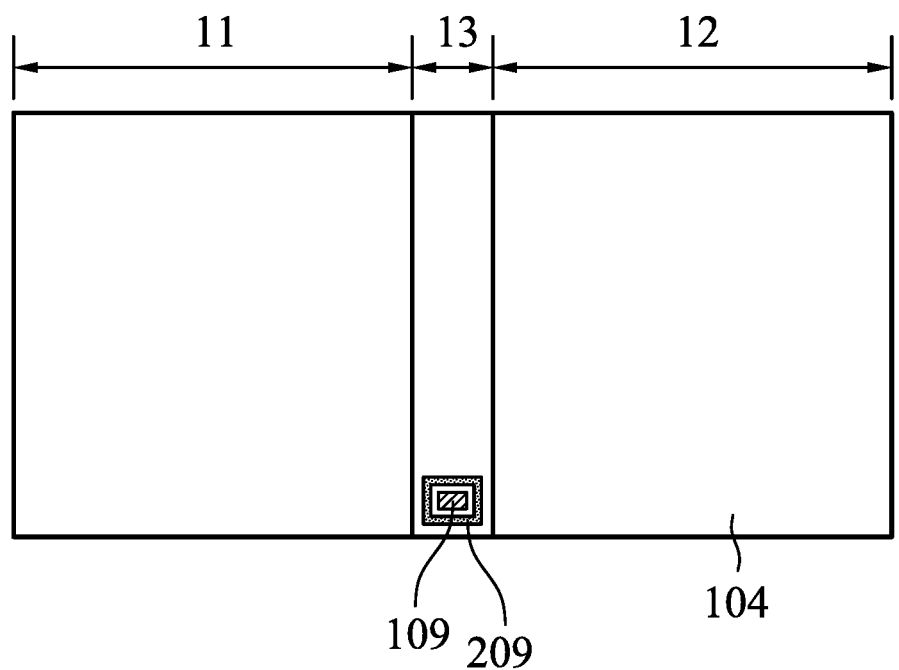
FIG. 4D shows a top-view representation of a monitoring pattern in the redistribution structure of the package structure, in accordance with some embodiments of the disclosure.

FIG. 4D shows a top-view representation of the monitoring pattern in the redistribution structure 110 of the package structure 100a, in accordance with some embodiments of the disclosure.

As shown in FIG. 4D, when the first mark 16 and the second mark 26 are respectively transferred to a first monitor conductive line 109 and a second monitor conductive line 209 in the redistribution structure 110. The first monitor conductive line 109 and the second monitor conductive line 209 are configured to identify if the first mask 10 is aligned with the second mask 20. The first monitor conductive line 109 is not in contact with the second monitor conductive line 209 when the first mask 10 is aligned with the second mask 20. In some other embodiments, if the first mask 10 is misaligned with the second mask 20, the first monitor conductive line 109 is in contact with second monitor conductive line 209.

Figure 5A:
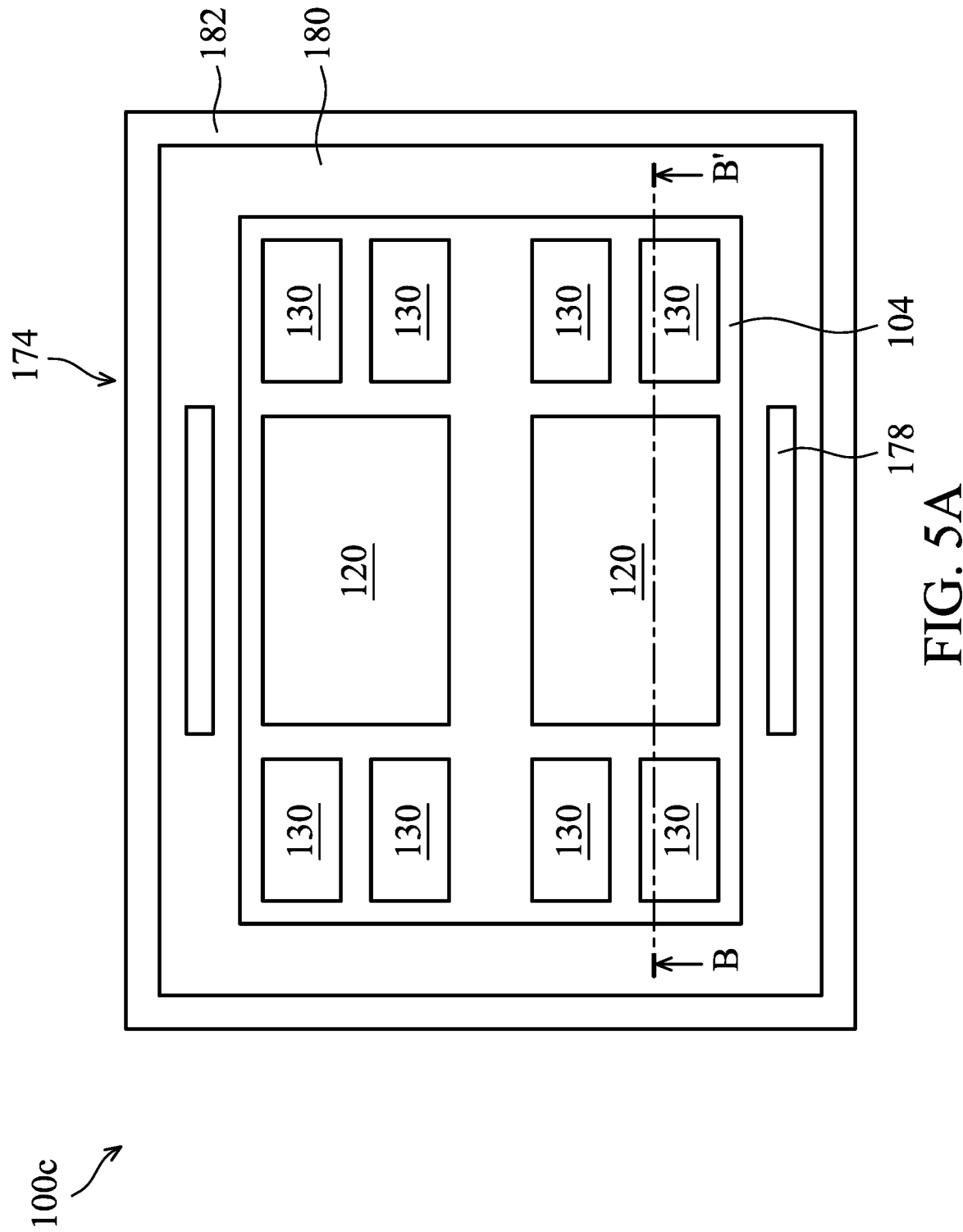
FIG. 5A shows a top-view representation of a package structure, in accordance with some embodiments of the disclosure.

FIG. 5A shows a top-view representation of the package structure 100c, in accordance with some embodiments of the disclosure. The package structure 100c is similar to, or the same as, the package structure 100a shown in FIG. 1, except that the size of the package structure 100c is greater than the size of the package structure 100a. Processes and materials used to form the semiconductor device structure 100c may be similar to, or the same as, those used to form the semiconductor device structure 100a and are not repeated herein. FIG. 2L shows a cross-sectional representation taken along line B-B' of FIG. 5A.

As shown in FIG. 5A, the package unit 174 is formed over the package substrate 180, and the package unit 174 is surrounded by the ring 182. In some embodiments, the package unit 174 includes two semiconductor dies 120 and eight die stacks 130 surrounding the semiconductor dies 120.

Figure 5B:
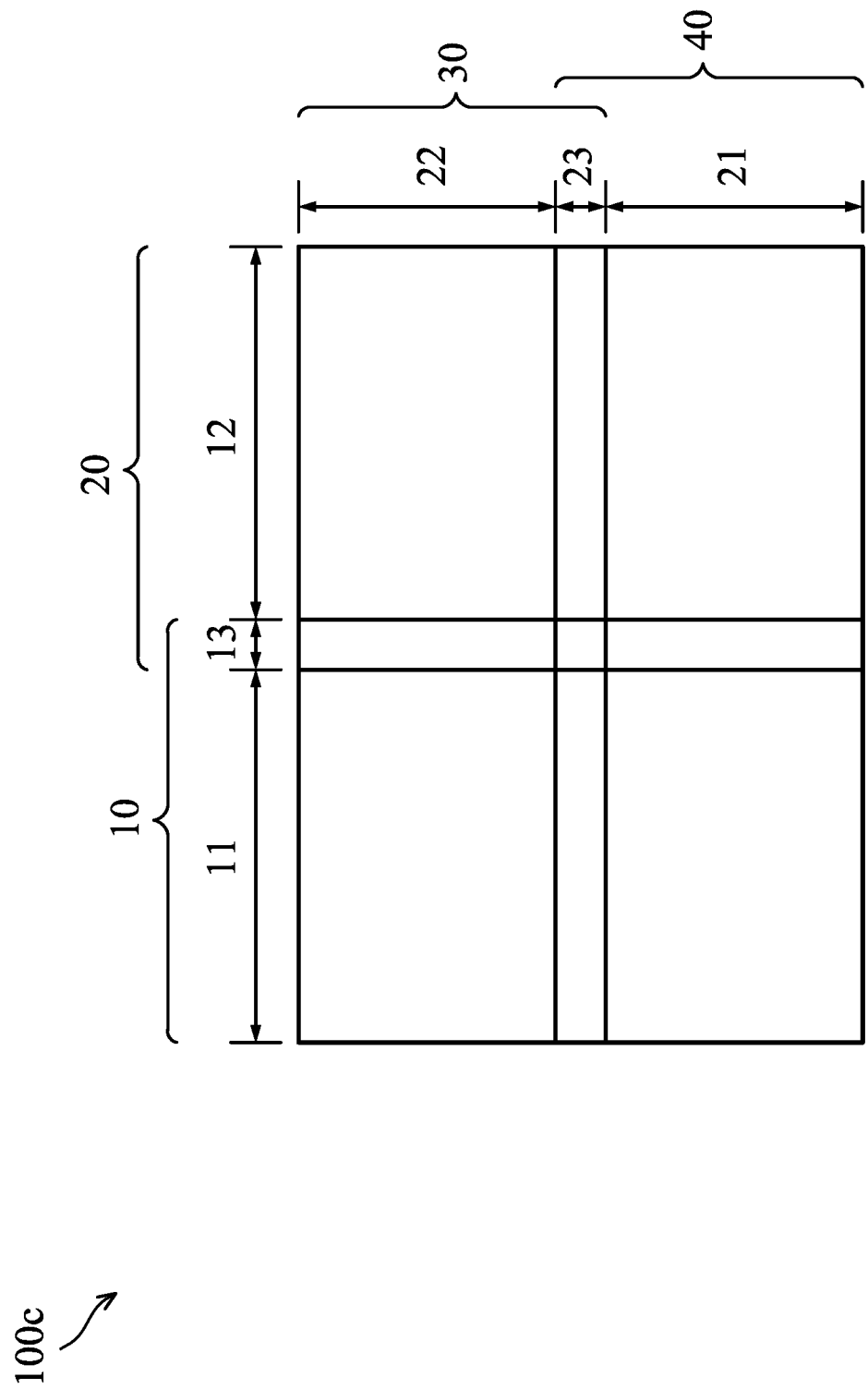
FIG. 5B shows a top-view representation of overlapping between a first mask, a second mask, a third mask and a fourth mask, in accordance with some embodiments of the disclosure.

FIG. 5B shows a top-view representation of the overlap of the first mask 10, the second mask 20, a third mask 30 and a fourth mask 40, in accordance with some embodiments of the disclosure.

As shown in FIG. 5B, there are four masks 10, 20, 30, 40 used to form the conductive lines in the redistribution structure 110. A portion of the first mask 10 overlaps a portion of the second mask 20 to form a first overlapping portion. A portion of the third mask 30 overlaps a portion of the fourth mask 40 to form a second overlapping portion. The first overlapping portion is in the third region 13, and the second overlapping portion is in the sixth region 23.

Figure 5C:
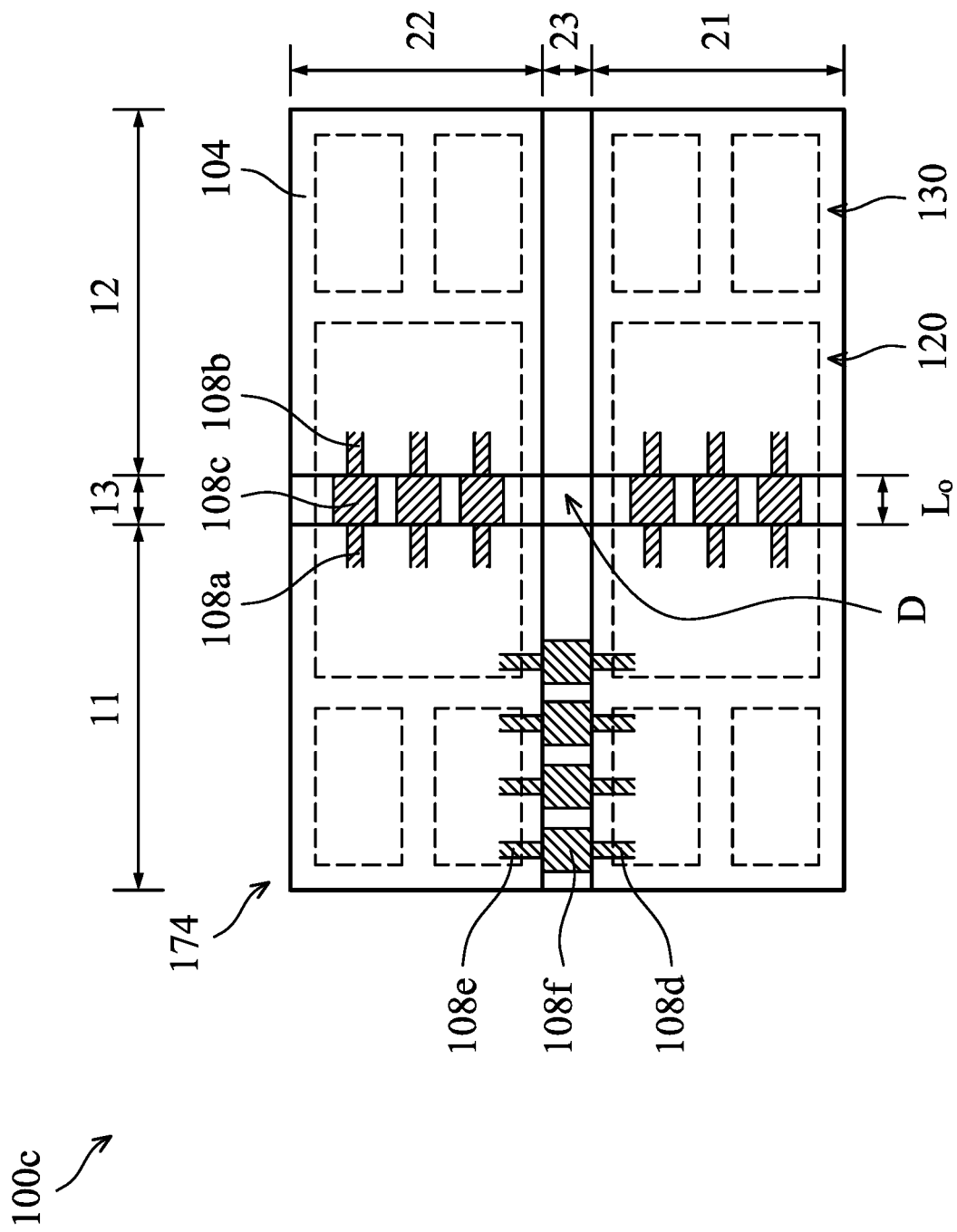
FIG. 5C shows a top-view representation of a conductive layer of the package structure, in accordance with some embodiments of the disclosure.

FIG. 5C shows a top-view representation of the conductive layer 108 of the package structure 100c, in accordance with some embodiments of the disclosure. Since the size of the package structure 100c is larger than the size of the package structure 100a, four masks may be used to form the redistribution structure 110 below two semiconductor dies 120 and eight die stacks 130.

As shown in FIG. 5C, since four masks 10, 20, 30, 40 are used to form the redistribution structure 110, two overlapping regions are in the dielectric layer 104. The first overlapping region is referred to as the third region 13, and the second overlapping region is referred to as the sixth region 23.

The redistribution structure 110 includes a number of conductive layers 108 in a number of dielectric layers 104. One of the conductive layers 108 includes the first conductive line 108a in the first region 11, the second conductive line 108b in the second region 12, and the first overlapping conductive line 108c in the third region 13. The first conductive line 108a is parallel to the second conductive line 108b. In addition, the package structure 100c further includes a fourth conductive line 108d in the fourth region 21, a fifth conductive line 108e in the fifth region 22 and a second overlapping conductive line 108f in the sixth region 23. The first overlapping conductive line 108c extends in a first direction, and the second overlapping conductive line 108f extends in a second direction. The first direction is perpendicular to the second direction. In some embodiments, the first overlapping conductive line 108c is directly below the semiconductor die 120. In some embodiments, the second overlapping conductive line 108f is directly below a region which is an aisle between the semiconductor die 120 and the die stack 130.

Similar to first overlapping conductive line 108c, the width of the second overlapping conductive line 108f is greater than the width of the fourth conductive line 108d or the width of the fifth conductive line 108e. Furthermore, a middle region D where the first region 13 crosses the sixth region 23 is exposed four times.

Figure 5D:
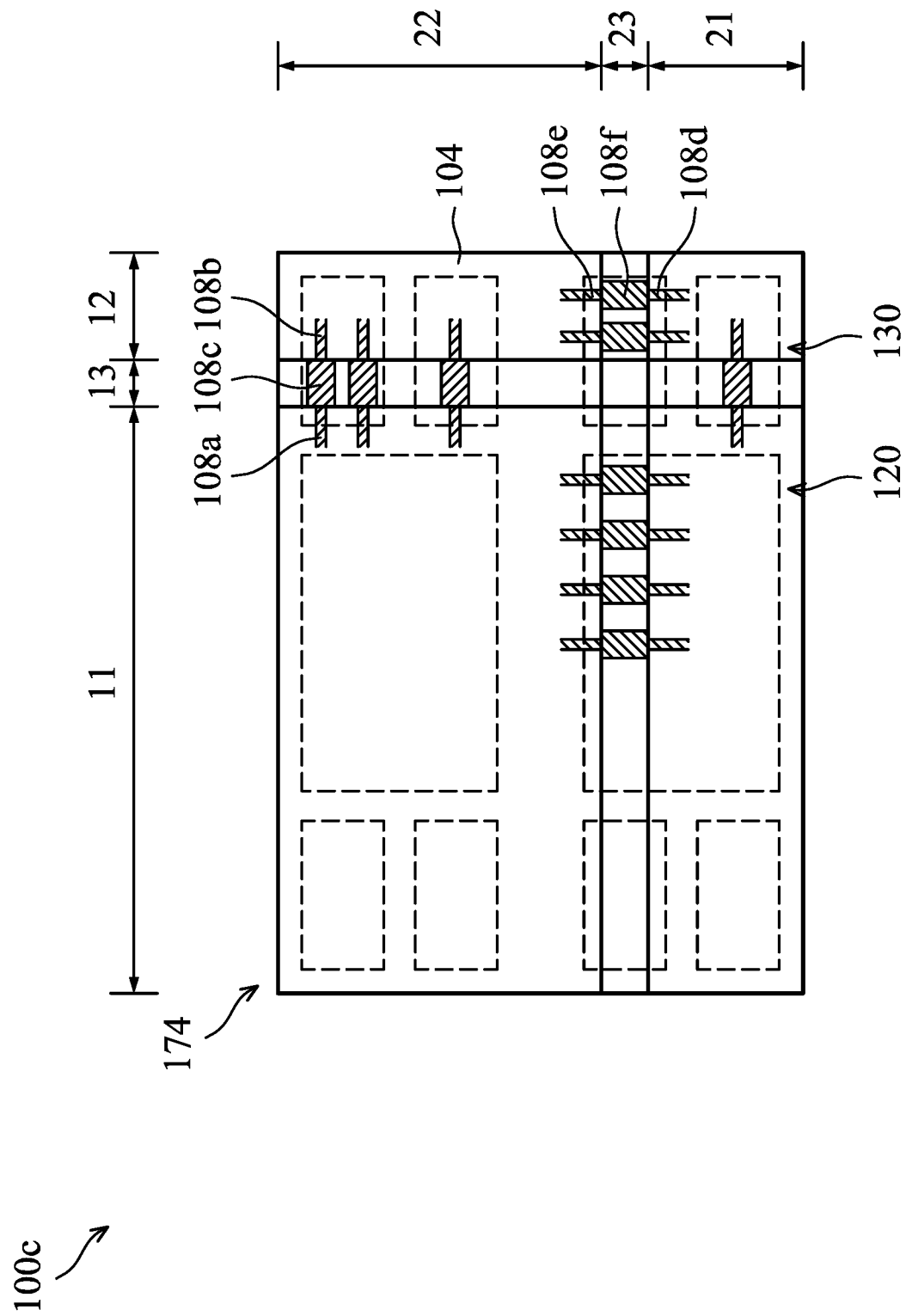
FIG. 5D shows a top-view representation of a conductive layer of the package structure, in accordance with some embodiments of the disclosure.

FIG. 5D shows a top-view representation of the conductive layer 108 of the package structure 100c, in accordance with some embodiments of the disclosure. Since four masks 10, 20, 30, 40 are used to form the redistribution structure 110, two overlapping regions are in the dielectric layer 104. The first overlapping region is referred to as the third region 13, and the second overlapping region is referred to as the sixth region 23.

As shown in FIG. 5D, the first overlapping conductive line 108c is formed in the third region 13, and the second overlapping conductive line 108f is formed in the sixth region 23. In addition, the first overlapping conductive line 108c extends in a first direction, and the second overlapping conductive line 108f extends in a second direction. In some embodiments, the first overlapping conductive line 108c is directly below the die stack 130. In some embodiments, the second overlapping conductive line 108f is directly below the semiconductor die 120 and the die stack 130.

Figure 6A:
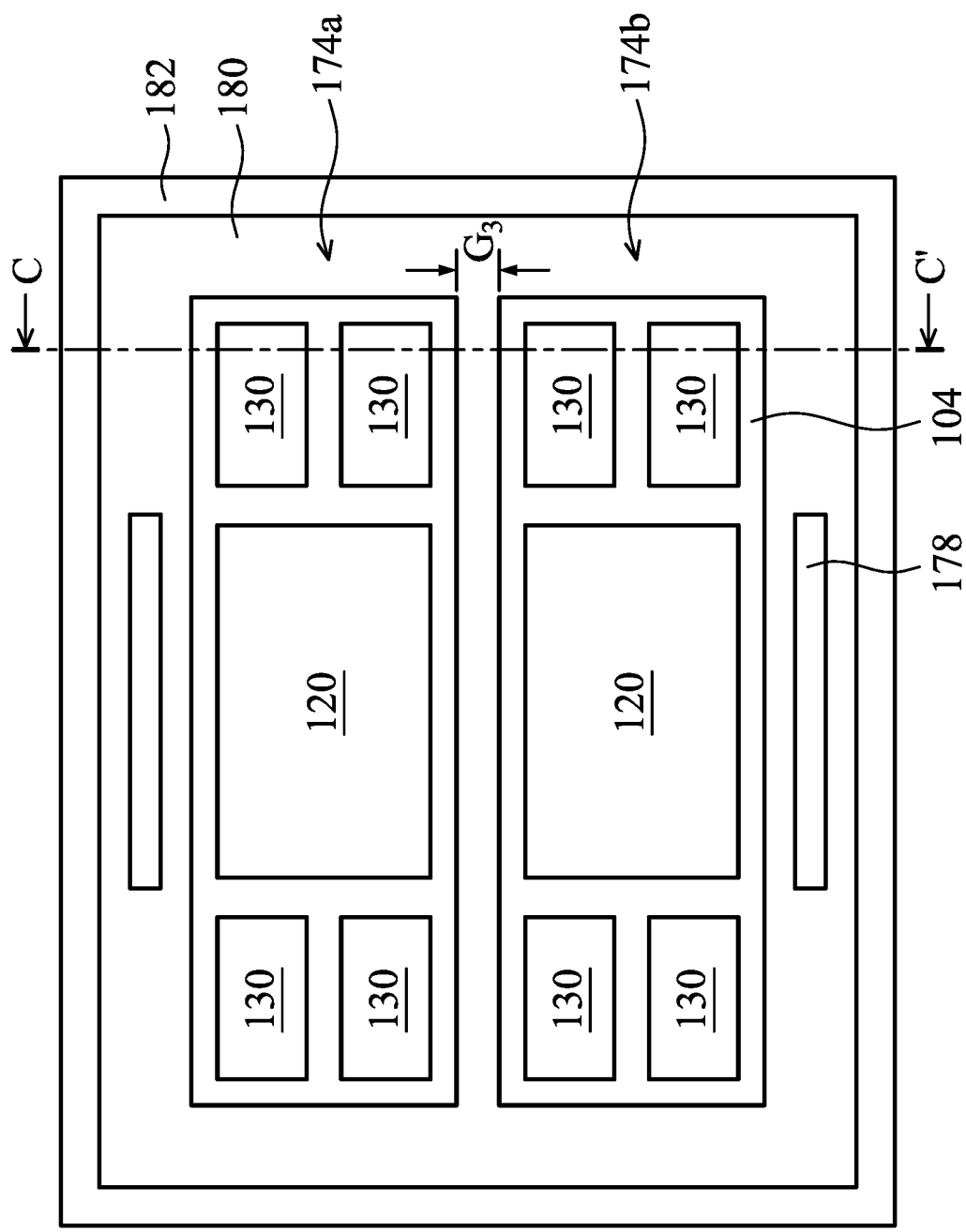
FIG. 6A shows a top-view representation of a package structure, in accordance with some embodiments of the disclosure.
Figure 6B:
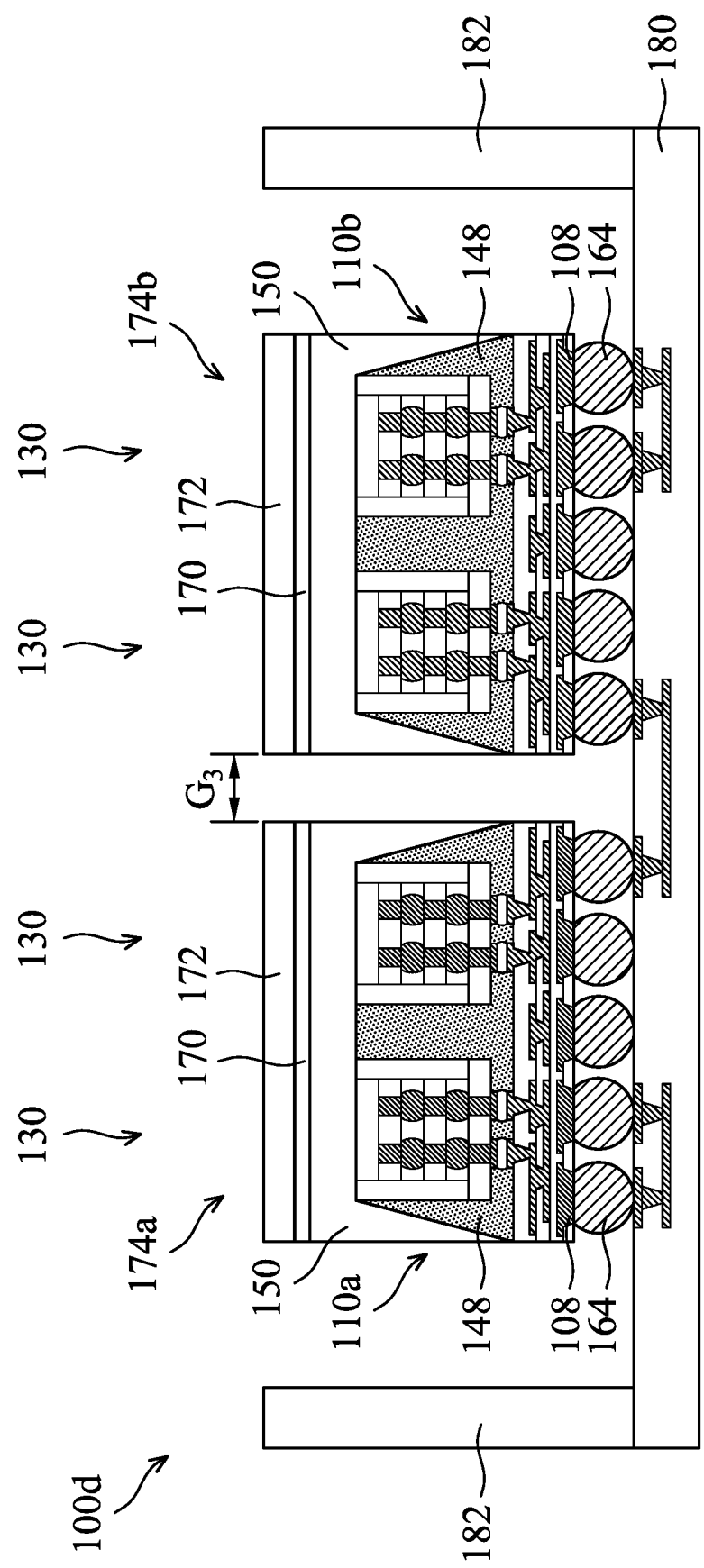
FIG. 6B shows a cross-sectional representation taken along line C-C' of FIG. 6A, in accordance with some embodiments of the disclosure.

FIG. 6A shows a top-view representation of the package structure 100d, in accordance with some embodiments of the disclosure. FIG. 6B shows a cross-sectional representation taken along line C-C' of FIG. 6A, in accordance with some embodiments of the disclosure. Two fan-out package units are formed and enclosed by the ring 182.

The package structure 100d is similar to, or the same as, the package structure 100c shown in FIG. 5A, except that two package units 174 are formed over the package substrate 180. Processes and materials used to form the semiconductor device structure 100d may be similar to, or the same as, those used to form the semiconductor device structure 100c and are not repeated herein.

As shown in FIGS. 6A and 6B, two fan-out package units 174 are formed over the package substrate 180. The first package unit 174a includes one semiconductor die 120 and four die stacks 130 over a first redistribution structure 110a (shown in FIG. 6B). The second package unit 174b includes one semiconductor die 120 and four die stacks 130 over a first redistribution structure 110b (shown in FIG. 6B). A third gap $G_3$ is defined as a distance between the first package unit 174a and the second package unit 174b. In some embodiments, the third gap $G_3$ is in a range from about 0.7 mm to about 2 mm.

Figure 6C:
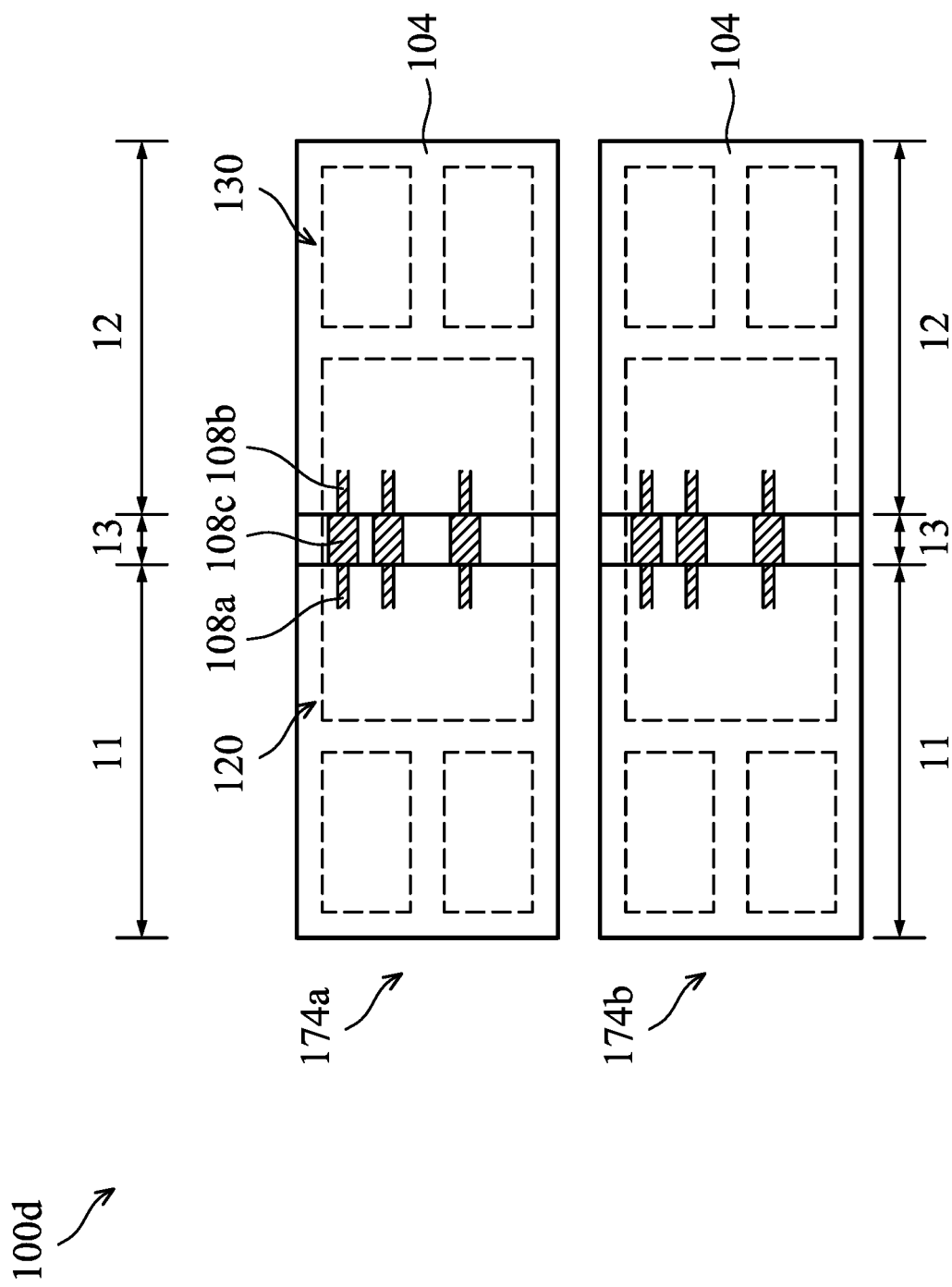
FIG. 6C shows a top-view representation of a conductive layer of the package structure, in accordance with some embodiments of the disclosure.

FIG. 6C shows a top-view representation of the conductive layer 108 of the package structure 100d, in accordance with some embodiments of the disclosure.

As shown in FIG. 6C, the first redistribution structure 110a of the first package unit 174a (shown in FIG. 6B) is formed by two masks, and therefore the overlapping region 13 is formed in the first package unit 174a. The overlapping conductive line 108c is in the overlapping region 13 in the first package unit 174a. Similarly, the second redistribution structure 110b of the second package unit 174b is formed by two masks, and therefore the overlapping region 13 is formed in the second package unit 174b. The overlapping conductive line 108c is in the overlapping region 13 in the second package unit 174b.

Figure 6D:
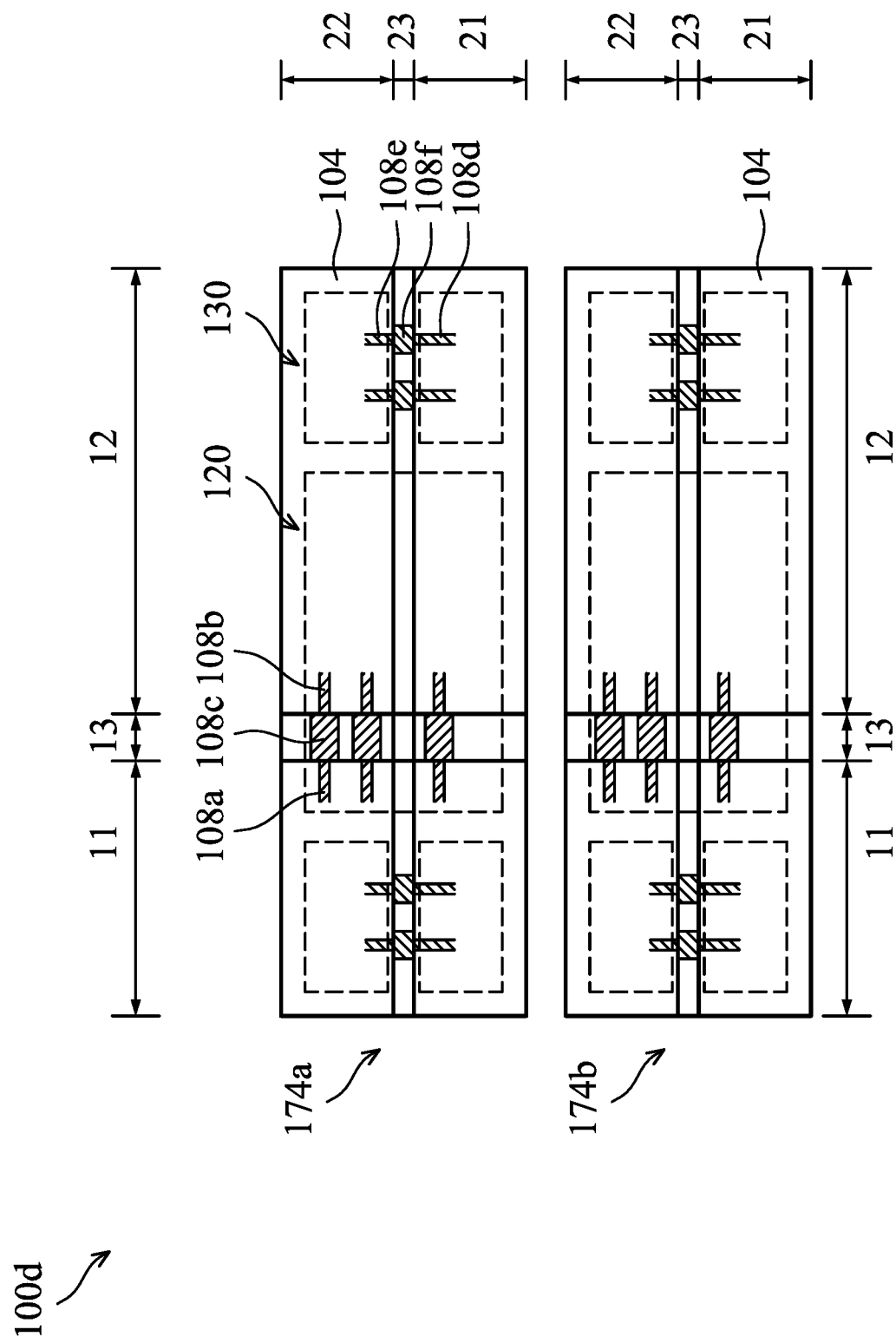
FIG. 6D shows a top-view representation of the conductive layer of the package structure, in accordance with some embodiments of the disclosure.

FIG. 6D shows a top-view representation of the conductive layer 108 of the package structure 100d, in accordance with some embodiments of the disclosure.

As shown in FIG. 6D, the first redistribution structure 110a of the first package unit 174a is formed by four masks, and therefore the first overlapping region 13 and second overlapping region 23 are formed in the first package unit 174a. Furthermore, the first overlapping region 13 and second overlapping region 23 are also formed in the second package unit 174b.

Figure 7A:
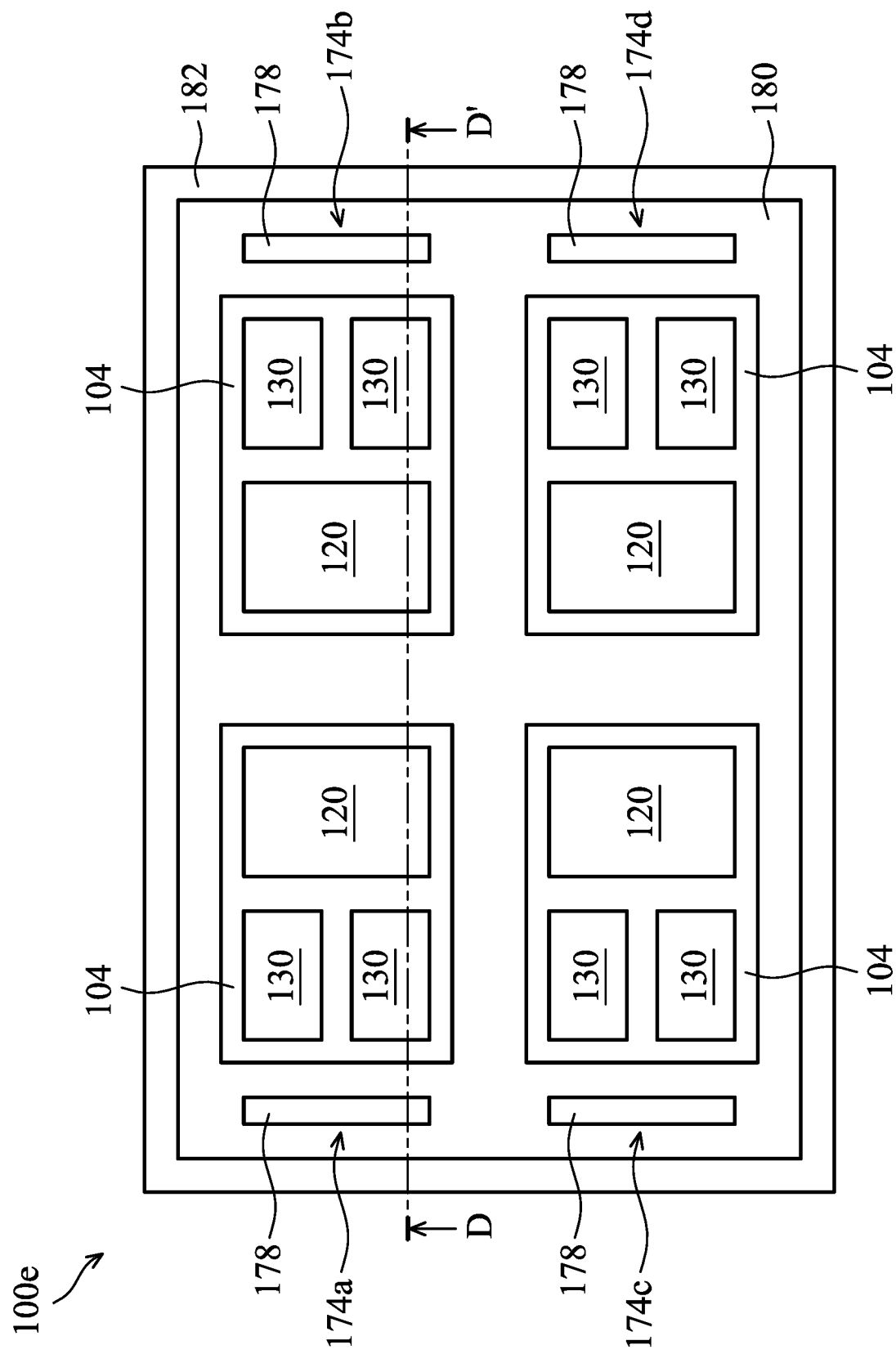
FIG. 7A shows a top-view representation of a package structure, in accordance with some embodiments of the disclosure.
Figure 7B:
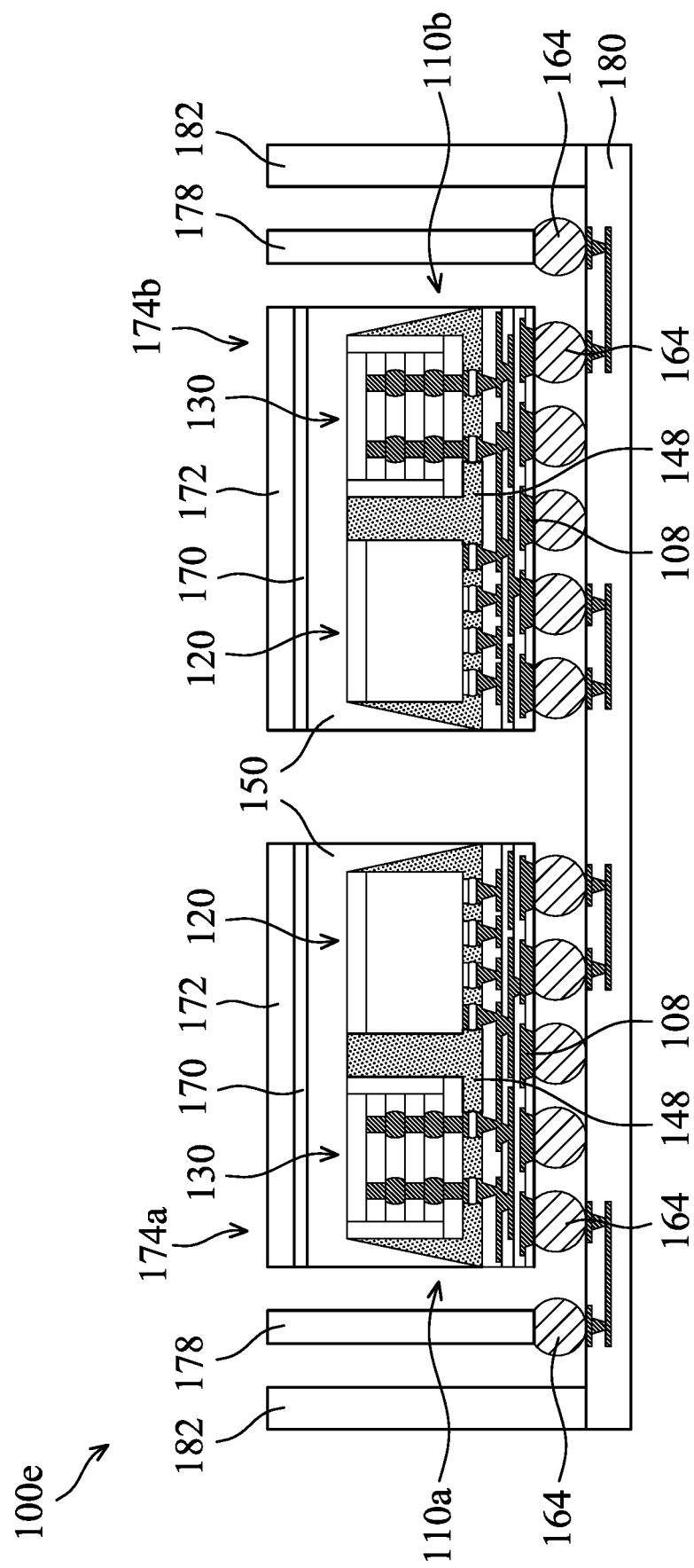
FIG. 7B shows a cross-sectional representation taken along line D-D' of FIG. 7A, in accordance with some embodiments of the disclosure.

FIG. 7A shows a top-view representation of the package structure 100e, in accordance with some embodiments of the disclosure. FIG. 7B shows a cross-sectional representation taken along line D-D' of FIG. 7A, in accordance with some embodiments of the disclosure. Four fan-out package units are formed in the ring 182.

As shown in FIGS. 7A and 7B, the first package unit 174a, the second package unit 174b, the third package unit 174c and the fourth package unit 174d are formed over the package substrate 180. The first package unit 174a, the second package unit 174b, the third package unit 174c and the fourth package unit 174d are insulated from each other. The first package unit 174a includes one semiconductor die 120 and two die stacks 130 over a first redistribution structure 110a. The second package unit 174b includes one semiconductor die 120 and two die stacks 130 over a second redistribution structure 110b.

Figure 7C:
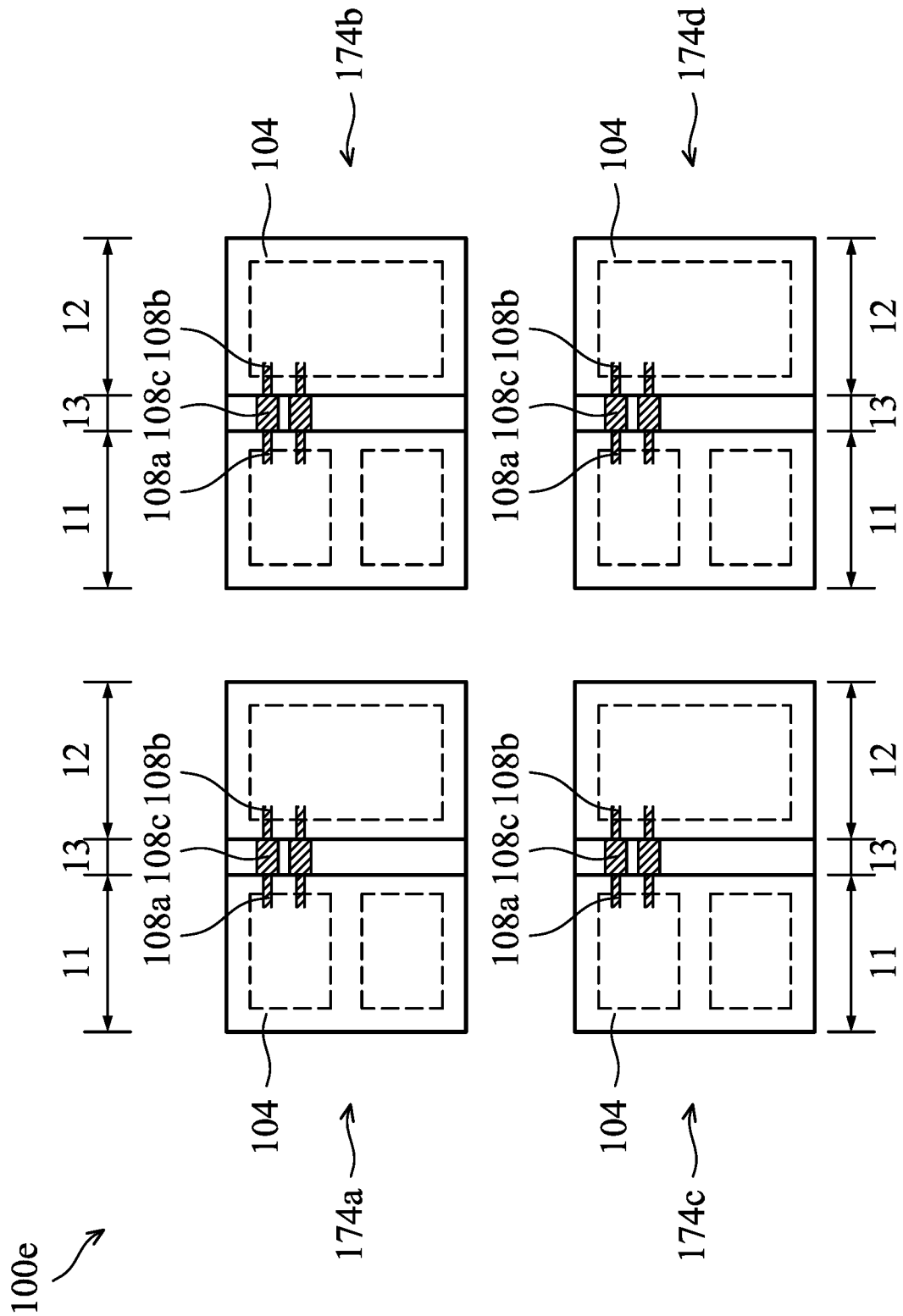
FIGS. 7C-7E show top-view representations of a conductive layer of the package structure, in accordance with some embodiments of the disclosure.
Figure 7D:
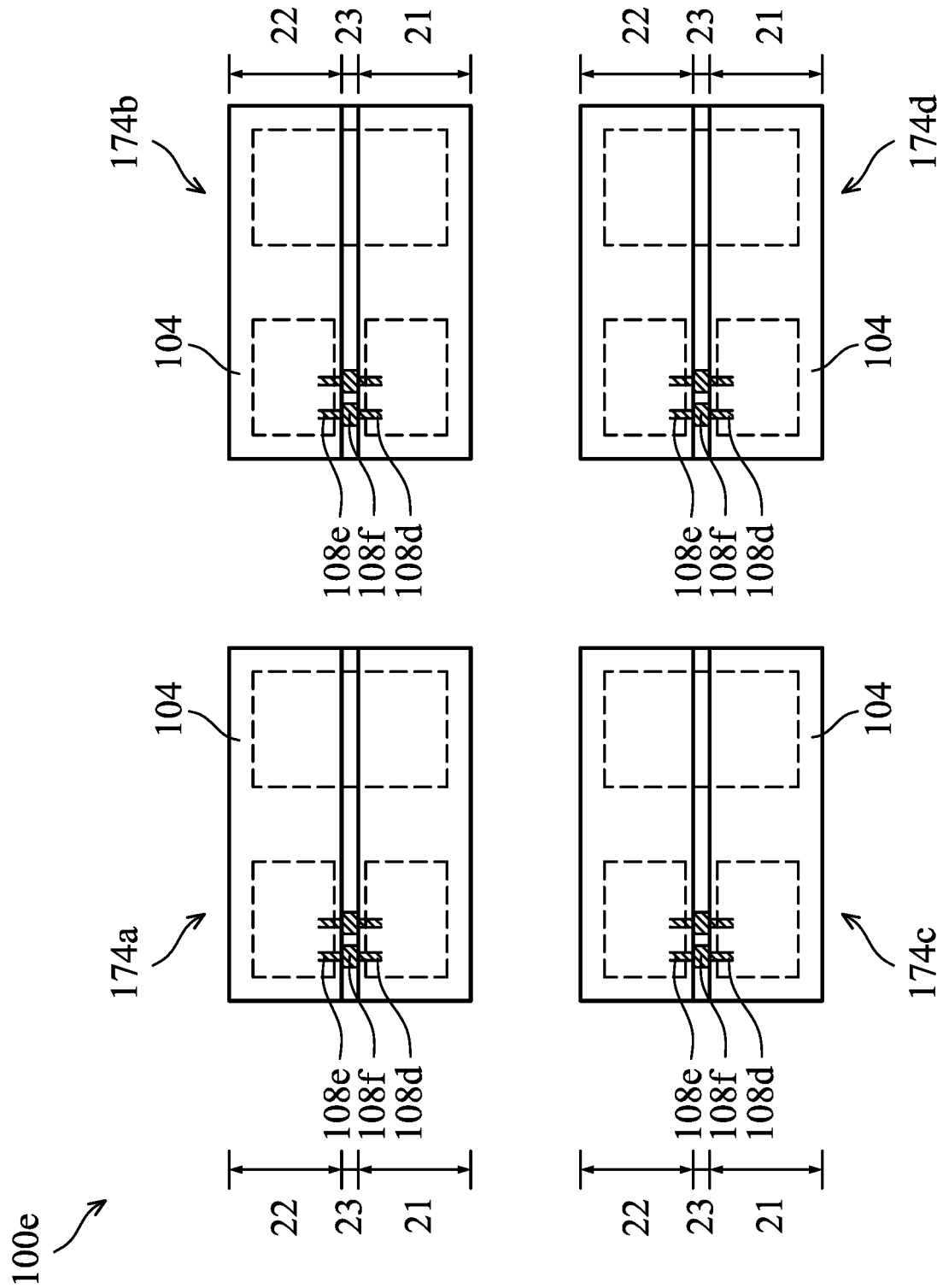
Figure 7E:
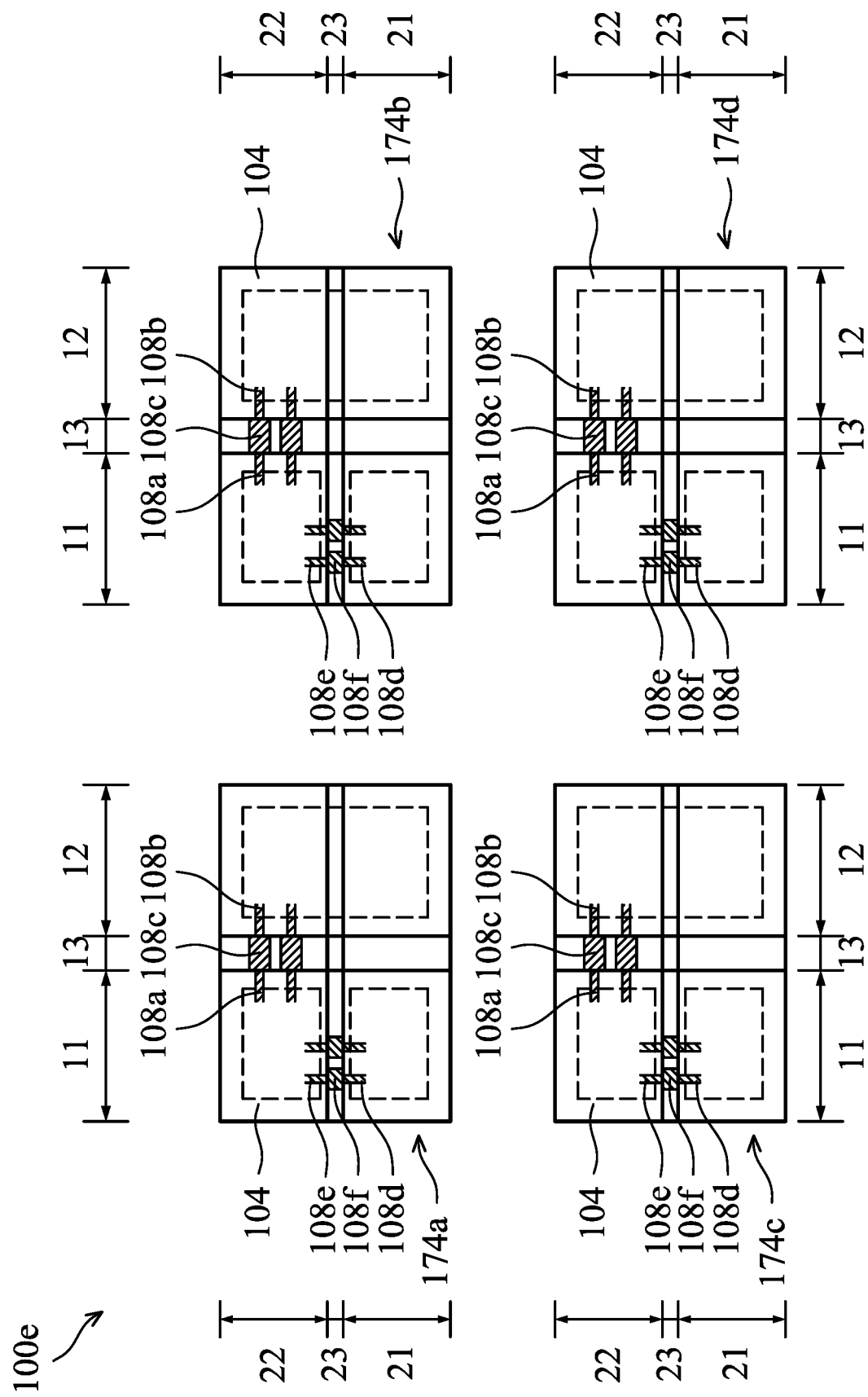

FIGS. 7C-7E show top-view representations of the conductive layer 108 of the package structure 100e, in accordance with some embodiments of the disclosure.

As shown in FIG. 7C, the first redistribution structure 110a (shown in FIG. 7B) of the first package unit 174a is formed by two masks, and therefore the first overlapping region 13 is formed in the first package unit 174a. In addition, each of the second package unit 174b, the third package unit 174c and the fourth package unit 174d has the first overlapping region 13.

As shown in FIG. 7D, each of the first package unit 174a, the second package unit 174b, the third package unit 174c and the fourth package unit 174d has a first overlapping region 13.

As shown in FIG. 7E, each of the first package unit 174a, the second package unit 174b, the third package unit 174c and the fourth package unit 174d has the first overlapping region 13 and the second overlapping region 23.

Figure 8A:
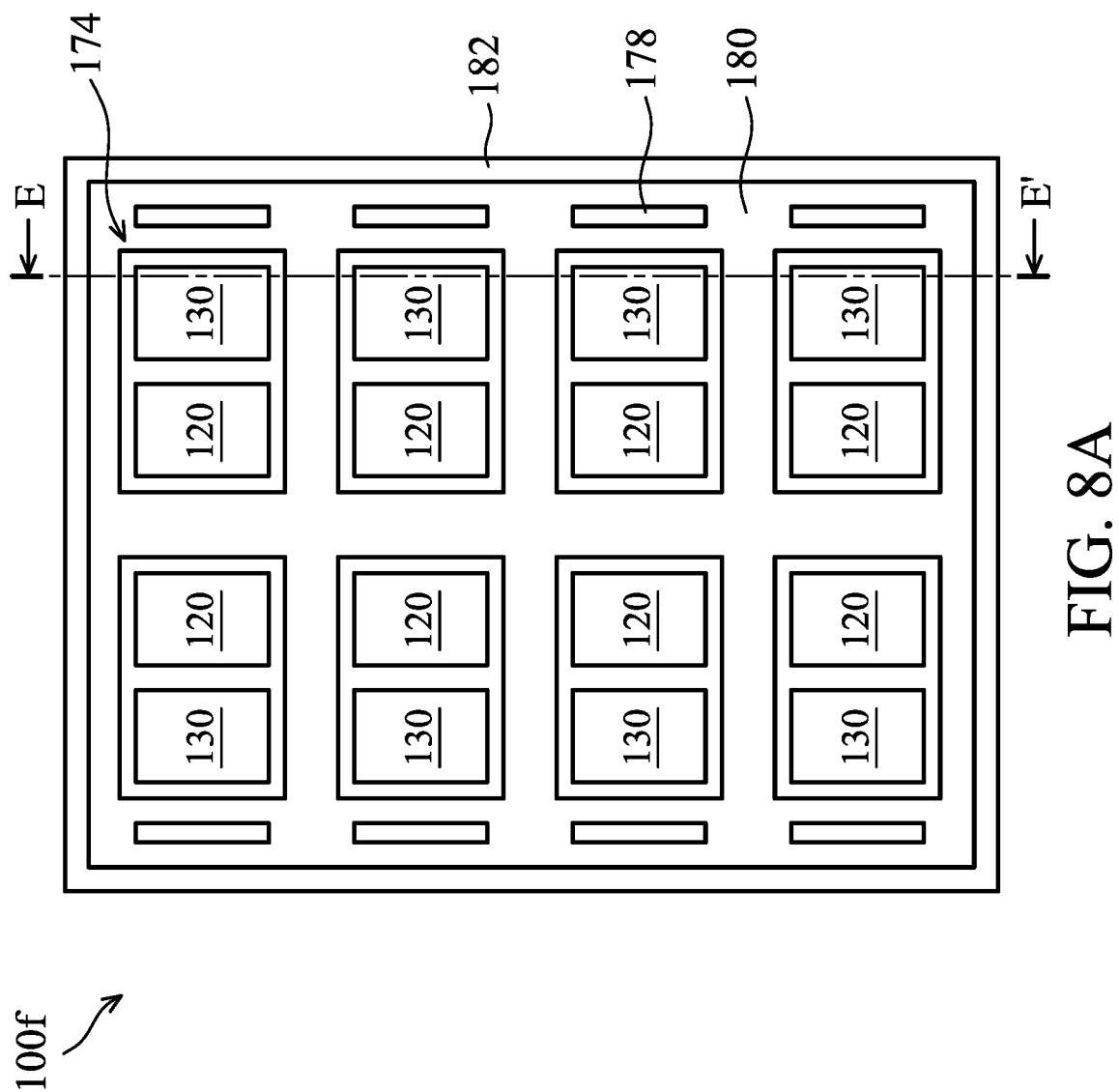
FIG. 8A shows a top-view representation of a package structure, in accordance with some embodiments of the disclosure.
Figure 8B:
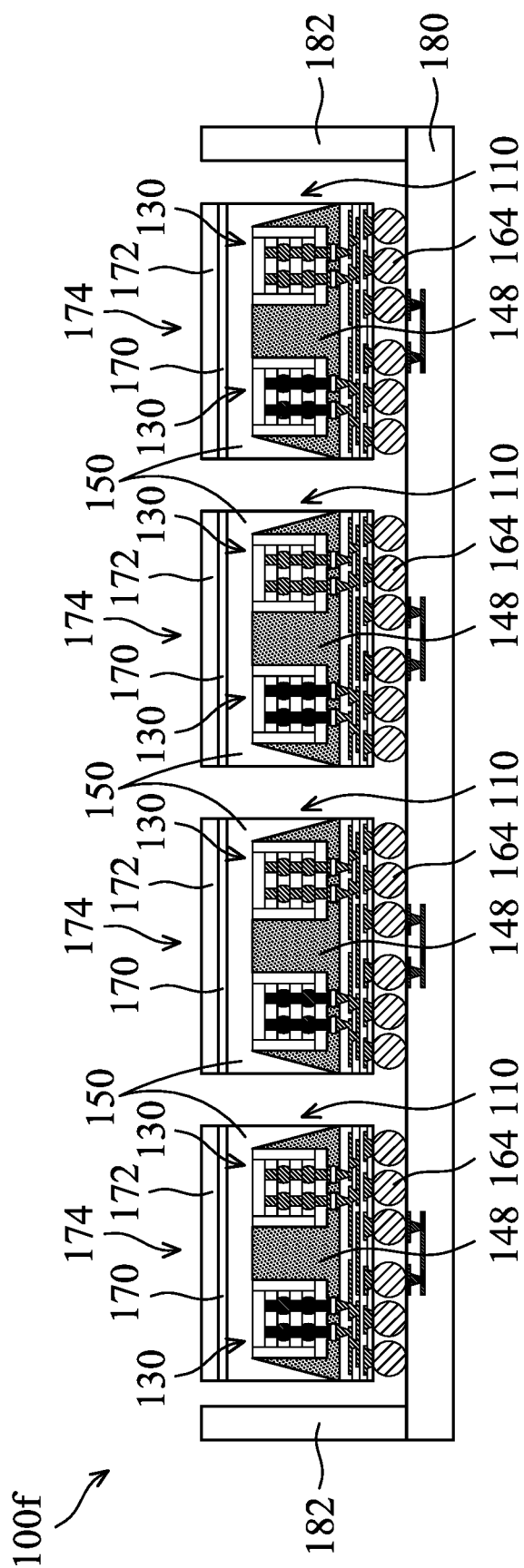
FIG. 8B shows a cross-sectional representation taken along line E-E' of FIG. 8A, in accordance with some embodiments of the disclosure.

FIG. 8A shows a top-view representation of the package structure 100f, in accordance with some embodiments of the disclosure. FIG. 8B shows a cross-sectional representation taken along line E-E' of FIG. 8A, in accordance with some embodiments of the disclosure. Eight fan-out package units are formed in the ring 182.

As shown in FIGS. 8A and 8B, eight package units 174 are formed over the package substrate 180. The package units 174 are all insulated from each other. Each of the package unit 174 includes one semiconductor die 120 and one die stack 130 over the redistribution structure 110.

As shown in FIGS. 6A, 7A and 8A, there are multiple fan-out redistribution structures 110 formed in the ring 182. In other words, multiple package units 174 are formed over the package substrate 180. Since each size of the fan-out redistribution structures 110 is greater than the maximum size of one reticle, two or more masks are used to form a larger fan-out redistribution structure 110.

In some embodiments, two masks (such as first mask 10 and the second mask 20) are used to form the overlapping conductive line 108c in the overlapping region 13. In some embodiments, four masks are used to form the first overlapping conductive line 108c in the first overlapping region 13 and the second overlapping conductive line 108f in the second overlapping region 23. Furthermore, the issue of signal misalignment between two conductive lines can be resolved by using the overlapping conductive line with a greater width.

It should be noted that there is no TSV in the carrier substrate 102, and the redistribution structure 110 is electrically connected to the package substrate 180 by the conductive connector 164 without using any interposer substrate. Therefore, insertion loss and warpage caused by the interposer substrate can be prevented to obtain a high-reliability package structure.

Embodiments for forming a package structure and method for formation the same are provided. The package structure includes a redistribution structure formed over a carrier substrate. The redistribution structure is formed by more than two masks to form an overlapping conductive line between the first conductive line and a second conductive line. The package structure further includes the semiconductor die and the die stack are formed over the redistribution structure. The carrier substrate is then removed, and the conductive connector is formed below the redistribution structure. The overlapping conductive line can prevent the misalignment between the first conductive line and the second conductive line. In addition, there is no TSV in the carrier substrate, and therefore the insertion loss and warpage issues can be prevented. Therefore, the quality, the yield and reliability of the package structure are improved.

In some embodiments, a method for forming a package structure is provided. The method includes forming a dielectric layer over a carrier substrate, and the carrier substrate includes a first region, a second region and a third region between the first region and the second region. The method also includes forming a photoresist layer over the dielectric layer. The method also includes performing a first exposure process on the photoresist layer to form a first single exposed region, and performing a second exposure process on the photoresist layer to form a second single exposed region and a double exposed region. A width of the double exposed region is greater than a width of the first single exposed region. The method includes developing the photoresist layer to form a patterned photoresist layer and patterning the dielectric layer to form a trench by using the patterned photoresist layer as a mask. The method also includes forming a conductive layer in the trench in the dielectric layer, and the conductive layer includes a first conductive line in the first region, a second conductive line in the second region and an overlapping conductive line in the third region, a third width of the overlapping conductive line is wider than a first width of the first conductive line of the conductive layer. The method further includes forming a semiconductor die and a die stack over the conductive layer, and the semiconductor die has a different function than the die stack.

In some embodiments, a method for forming a package structure is provided. The method includes forming a dielectric layer over a carrier substrate, and the carrier substrate includes a first region, a second region and a third region between the first region and the second region. The method also includes forming a photoresist layer over the dielectric layer, and the photoresist layer includes a first portion in the first region, a second portion in the second region and a third portion in the third region. The method includes disposing a first mask over the first region and the third region and performing a first exposure process on the first portion and the third portion of the photoresist layer. The method also includes disposing a second mask over the second region and the third region and performing a second exposure process on the second portion and the third portion of the photoresist layer, and the third portion of the photoresist layer is a first overlapping portion which is exposed twice. The method further includes developing the photoresist layer to form a patterned photoresist layer and patterning the dielectric layer to form a trench. The method includes forming a first redistribution structure in the trench in the dielectric layer. The first redistribution structure includes a first conductive line in the first region and an overlapping conductive line in the third region, a third width of the overlapping conductive line is greater than a first width of the first conductive line. The method also includes forming a first package unit over the first redistribution structure, and the first package unit includes a first semiconductor die and a first die stack, and the first semiconductor die has a different function than the first die stack. The method further includes forming a package layer over the first package unit and removing the carrier substrate. The method also includes forming a package substrate below the first redistribution structure.

In some embodiments, a package structure is provided. The package structure includes a first redistribution structure formed over a substrate, and the first redistribution structure includes a first conductive line, a second conductive line and a first overlapping conductive line between the first conductive line and the second conductive line. The first conductive line has a first width, the second conductive line which is parallel to the first conductive line has a second width, and the overlapping conductive line has a third width which is greater than the first width and the second width. The package structure includes a first package unit formed over the first redistribution structure, and the first package unit includes a first semiconductor die and a first die stack, and the first semiconductor die has a different function than the first die stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a package structure, comprising:
    forming a dielectric layer over a carrier substrate, wherein the carrier substrate comprises a first region, a second region and a third region between the first region and the second region;
    forming a photoresist layer over the dielectric layer;
    performing a first exposure process on the photoresist layer to form a first single exposed region;
    performing a second exposure process on the photoresist layer to form a second single exposed region and a double exposed region, wherein a width of the double exposed region is greater than a width of the first single exposed region;
    developing the photoresist layer to form a patterned photoresist layer;
    patterning the dielectric layer to form a trench by using the patterned photoresist layer as a mask;
    forming a conductive layer in the trench in the dielectric layer, wherein the conductive layer comprises a first conductive line in the first region, a second conductive line in the second region and an overlapping conductive line in the third region, and a third width of the overlapping conductive line is wider than a first width of the first conductive line of the conductive layer; and
    disposing a semiconductor die and a die stack over the conductive layer, wherein the semiconductor die has a different function than the die stack.

2. The method for forming the package structure as claimed in claim 1, further comprising:
    removing the carrier substrate to expose a portion of the dielectric layer;
    removing the portion of the dielectric layer to expose a portion of the conductive layer;
    forming a connector below the conductive layer, wherein the connector is in direct contact with the overlapping conductive line of the conductive layer; and
    disposing a substrate below the connector.

3. The method for forming the package structure as claimed in claim 1, wherein the die stack comprises a plurality of memory dies, and the semiconductor die has a different function than each of the plurality of the memory dies.

4. The method for forming the package structure as claimed in claim 1, wherein the overlapping conductive line overlaps the semiconductor die or the die stack.

5. The method for forming the package structure as claimed in claim 1, wherein the first exposure process and the second exposure process are performed in the same chamber.

6. The method for forming the package structure as claimed in claim 1, wherein the first conductive line is parallel to the second conductive line.

7. The method for forming the package structure as claimed in claim 1, further comprising:
    forming an underfill layer between the semiconductor die and the die stack; and
    forming a package layer over the underfill layer, wherein an interface between the underfill layer and the package layer is lower than a top surface of the semiconductor die; and
    forming a ring surrounding the package layer.

8. The method for forming the package structure as claimed in claim 1, wherein no through via is formed in the carrier substrate.

9. The method for forming the package structure as claimed in claim 1, wherein the semiconductor die has a first height, the die stack has a second height, and the second height is greater than the first height.

10. A method for forming a package structure, comprising:
    forming a dielectric layer over a carrier substrate, wherein the carrier substrate comprises a first region, a second region and a third region between the first region and the second region;
    forming a photoresist layer over the dielectric layer, wherein the photoresist layer comprises a first portion in the first region, a second portion in the second region and a third portion in the third region;
    disposing a first mask over the first region and the third region;
    performing a first exposure process on the first portion and the third portion of the photoresist layer;
    disposing a second mask over the second region and the third region;
    performing a second exposure process on the second portion and the third portion of the photoresist layer, wherein the third portion of the photoresist layer is a first overlapping portion which is exposed twice;
    developing the photoresist layer to form a patterned photoresist layer;
    patterning the dielectric layer to form a trench;
    forming a first redistribution structure in the trench in the dielectric layer, wherein the first redistribution structure comprises a first conductive line in the first region and an overlapping conductive line in the third region, a third width of the overlapping conductive line is greater than a first width of the first conductive line;
    forming a first package unit over the first redistribution structure, wherein the first package unit comprises a first semiconductor die and a first die stack, and the first semiconductor die has a different function than the first die stack;
    forming a package layer over the first package unit;
    removing the carrier substrate; and
    forming a package substrate below the first redistribution structure.

11. The method for forming the package structure as claimed in claim 10, further comprising:
- performing a third exposure process on a fourth portion and a sixth portion of the photoresist layer;
- performing a fourth exposure process on a fifth portion and the sixth portion of the photoresist layer before developing the photoresist layer to form a patterned photoresist layer, wherein the sixth portion is a second overlapping portion which is exposed twice.

12. The method for forming the package structure as claimed in claim 10, further comprising:
- forming a second redistribution structure over the package substrate, wherein the second redistribution structure is insulated from the first redistribution structure, the second redistribution structure comprises a third conductive line, a fourth conductive line and a second overlapping conductive line between the third conductive line and the fourth conductive line, and a sixth width of the second overlapping conductive line is greater than a fourth width of the fourth conductive line.

13. The method for forming the package structure as claimed in claim 10, further comprising:
- forming a plurality of first conductive connectors formed on a first side of the first redistribution structure, wherein a first gap is formed between two adjacent first conductive connectors;
- forming a plurality of second conductive connectors formed below a second side of the first redistribution structure, wherein a second gap is formed between two adjacent second conductive connectors, and the second gap is greater than the first gap.

14. The method for forming the package structure as claimed in claim 13, further comprising:
- removing a portion of the dielectric layer to expose a portion of the first redistribution structure after removing the carrier substrate; and
- forming the plurality of second conductive connectors below the first redistribution structure.

15. A method for forming a package structure, comprising:
- forming a dielectric layer over a carrier substrate, wherein the carrier substrate comprises a first region, a second region and a third region between the first region and the second region;
- forming a photoresist layer over the dielectric layer;
- performing a first exposure process on the photoresist layer to expose a first portion of the photo resist layer and an overlapping portion of the photoresist layer;
- performing a second exposure process on the photoresist layer to expose a second portion of the photo resist layer and the overlapping portion of the photoresist layer, wherein the overlapping portion is positioned between the first portion and the second portion;
- developing the photoresist layer to form a patterned photoresist layer;
- patterning the dielectric layer to form a trench positioned above the first region, the second region, and the third region;
- forming a conductive layer in the trench in the dielectric layer, wherein the conductive layer comprises a first conductive line in the first region, and an overlapping conductive line in the third region, and a third width of the overlapping conductive line is wider than a first width of the first conductive line of the conductive layer; and
- disposing a semiconductor die and a die stack over the conductive layer, wherein the semiconductor die has a different function than the die stack.

16. The method for forming the package structure as claimed in claim 15, wherein the semiconductor die overlaps the overlapping conductive line, and the die stack does not overlap the overlapping conductive line in a normal direction of the carrier substrate.

17. The method for forming the package structure as claimed in claim 15, further comprising forming a ring surrounding the semiconductor die and the die stack.

18. The method for forming the package structure as claimed in claim 15, wherein the semiconductor die has a first height, the die stack has a second height, and the second height is greater than the first height.

19. The method for forming the package structure as claimed in claim 15, further comprising forming a conductive connector between the dielectric layer and the semiconductor die, and between the dielectric layer and the die stack.

20. The method for forming the package structure as claimed in claim 15, further comprising:
- removing the carrier substrate;
- bonding the conductive layer to a package substrate by conductive connectors; and
- bonding input/output port on the package substrate, wherein the input/output port is electrically connected to the conductive layer by the conductive connectors.

* * * * *